United States Patent
Lee et al.

(10) Patent No.: US 8,937,326 B2
(45) Date of Patent: Jan. 20, 2015

(54) LED PACKAGE HAVING AN ARRAY OF LIGHT EMITTING CELLS COUPLED IN SERIES

(75) Inventors: Chung Hoon Lee, Gwangmyeong-si (KR); Keon Young Lee, Ansan-si (KR); Hong San Kim, Seongnam-si (KR); Dae Won Kim, Seoul (KR); Hyuck Jung Choi, Seoul (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 13/033,702

(22) Filed: Feb. 24, 2011

(65) Prior Publication Data

US 2011/0140135 A1 Jun. 16, 2011

Related U.S. Application Data

(63) Continuation of application No. 11/908,112, filed as application No. PCT/KR2005/003565 on Oct. 26, 2005, now Pat. No. 8,076,680.

(30) Foreign Application Priority Data

| Mar. 11, 2005 | (KR) | 10-2005-0020377 |
| Mar. 29, 2005 | (KR) | 10-2005-0026067 |
| Mar. 29, 2005 | (KR) | 10-2005-0026078 |
| Mar. 29, 2005 | (KR) | 10-2005-0026090 |
| Mar. 29, 2005 | (KR) | 10-2005-0026108 |

(51) Int. Cl.
*H01L 33/62* (2010.01)
*H01L 27/15* (2006.01)
(Continued)

(52) U.S. Cl.
CPC ........... *H01L 27/153* (2013.01); *F21K 9/00* (2013.01); *H01L 33/486* (2013.01); *H01L 33/62* (2013.01);
(Continued)

(58) Field of Classification Search
USPC .............. 257/79, 88, E33.056, 98–100
See application file for complete search history.

(56) References Cited

U.S. PATENT DOCUMENTS

| 3,777,239 A | 12/1973 | Seri et al. |
| 5,463,280 A | 10/1995 | Johnson |

(Continued)

FOREIGN PATENT DOCUMENTS

| DE | 10213464 A1 | 10/2002 |
| DE | 10221504 | 11/2002 |

(Continued)

OTHER PUBLICATIONS

Non-Final Office Action of U.S Appl. No. 11/908,112 issued on Aug. 3, 2010.

(Continued)

*Primary Examiner* — Tran Tran
(74) *Attorney, Agent, or Firm* — H.C. Park & Associates, PLC

(57) ABSTRACT

Disclosed is a light emitting diode (LED) package having an array of light emitting cells coupled in series. The LED package comprises a package body and an LED chip mounted on the package body. The LED chip has an array of light emitting cells coupled in series. Since the LED chip having the array of light emitting cells coupled in series is mounted on the LED package, it can be driven directly using an AC power source.

12 Claims, 13 Drawing Sheets

(51) Int. Cl.
*F21K 99/00* (2010.01)
*H01L 33/48* (2010.01)
*H01L 33/64* (2010.01)

(52) U.S. Cl.
CPC ..... *H01L 33/642* (2013.01); *H01L 2224/48091* (2013.01); *H01L 2924/01322* (2013.01); *H01L 2924/12041* (2013.01); *H01L 2224/48137* (2013.01); *H01L 2224/48247* (2013.01)
USPC ............... 257/98; 257/99; 257/100; 257/101; 257/102

(56) References Cited

U.S. PATENT DOCUMENTS

| | | | |
|---|---|---|---|
| 5,487,999 A | 1/1996 | Farnworth | |
| 5,751,013 A | 5/1998 | Kidoguchi et al. | |
| 5,998,232 A | 12/1999 | Maruska | |
| 6,274,924 B1 | 8/2001 | Carey et al. | |
| 6,472,688 B2 | 10/2002 | Miyata | |
| 6,504,301 B1 | 1/2003 | Lowery | |
| 6,514,782 B1 | 2/2003 | Wierer, Jr. et al. | |
| 6,521,914 B2 | 2/2003 | Krames et al. | |
| 6,547,249 B2 | 4/2003 | Collins, III et al. | |
| 6,614,172 B2 | 9/2003 | Chiu et al. | |
| 6,635,902 B1 | 10/2003 | Lin | |
| 6,642,072 B2 | 11/2003 | Inoue et al. | |
| 6,871,982 B2 | 3/2005 | Holman et al. | |
| 6,885,035 B2 | 4/2005 | Bhat et al. | |
| 6,917,057 B2 * | 7/2005 | Stokes et al. | 257/98 |
| 6,957,899 B2 | 10/2005 | Jiang et al. | |
| 6,995,402 B2 | 2/2006 | Ludowise et al. | |
| 7,045,828 B2 | 5/2006 | Shimizu et al. | |
| 7,105,860 B2 | 9/2006 | Shei et al. | |
| 7,211,832 B2 | 5/2007 | Hirose | |
| 7,213,942 B2 | 5/2007 | Jiang et al. | |
| 7,221,044 B2 | 5/2007 | Fan et al. | |
| 7,276,739 B2 | 10/2007 | Chen et al. | |
| 7,372,082 B2 | 5/2008 | Kim et al. | |
| 7,391,153 B2 | 6/2008 | Suehiro et al. | |
| 7,405,433 B2 | 7/2008 | Chew | |
| 7,470,938 B2 | 12/2008 | Lee et al. | |
| 7,473,934 B2 | 1/2009 | Nagai et al. | |
| 7,489,086 B2 | 2/2009 | Miskin et al. | |
| 7,531,843 B2 | 5/2009 | Lin et al. | |
| 7,723,735 B2 | 5/2010 | Matsuda | |
| 7,723,736 B2 | 5/2010 | Lee et al. | |
| 7,838,891 B2 | 11/2010 | Lee et al. | |
| 7,842,959 B2 | 11/2010 | Lee et al. | |
| 7,906,788 B2 | 3/2011 | Nagai | |
| 2001/0007526 A1 | 7/2001 | Ohkohdo et al. | |
| 2001/0030866 A1 | 10/2001 | Hochstein | |
| 2002/0028527 A1 | 3/2002 | Maeda et al. | |
| 2002/0040982 A1 | 4/2002 | Uemura | |
| 2002/0042156 A1 * | 4/2002 | Chen | 438/26 |
| 2002/0068373 A1 | 6/2002 | Lo et al. | |
| 2002/0123164 A1 | 9/2002 | Slater et al. | |
| 2002/0139987 A1 | 10/2002 | Collins, III et al. | |
| 2002/0163006 A1 * | 11/2002 | Yoganandan et al. | 257/81 |
| 2002/0187571 A1 | 12/2002 | Collins, III et al. | |
| 2002/0197764 A1 | 12/2002 | Uemura et al. | |
| 2003/0015721 A1 | 1/2003 | Slater, Jr. et al. | |
| 2003/0168720 A1 | 9/2003 | Kamada | |
| 2003/0205712 A1 | 11/2003 | Bhat et al. | |
| 2003/0230606 A1 | 12/2003 | Devinie | |
| 2004/0012958 A1 | 1/2004 | Hashimoto et al. | |
| 2004/0026708 A1 | 2/2004 | Chen | |
| 2004/0046242 A1 | 3/2004 | Asakawa | |
| 2004/0075100 A1 | 4/2004 | Bogner et al. | |
| 2004/0075399 A1 | 4/2004 | Hall | |
| 2004/0080941 A1 | 4/2004 | Jiang et al. | |
| 2004/0113156 A1 | 6/2004 | Tamura et al. | |
| 2004/0140543 A1 | 7/2004 | Elpedes et al. | |
| 2004/0160173 A1 | 8/2004 | Shen et al. | |
| 2004/0206970 A1 | 10/2004 | Martin | |
| 2004/0211972 A1 | 10/2004 | Du et al. | |
| 2004/0217362 A1 | 11/2004 | Slater, Jr. et al. | |
| 2005/0001225 A1 | 1/2005 | Yoshimura et al. | |
| 2005/0023550 A1 | 2/2005 | Eliashevich et al. | |
| 2005/0072981 A1 | 4/2005 | Suenaga | |
| 2005/0077531 A1 | 4/2005 | Kim | |
| 2005/0077532 A1 | 4/2005 | Ota et al. | |
| 2005/0135105 A1 | 6/2005 | Teixeira et al. | |
| 2005/0162069 A1 | 7/2005 | Ota et al. | |
| 2005/0205890 A1 | 9/2005 | Uemura | |
| 2005/0211989 A1 | 9/2005 | Horio et al. | |
| 2005/0224829 A1 | 10/2005 | Negley et al. | |
| 2005/0225973 A1 | 10/2005 | Eliashevich et al. | |
| 2005/0248259 A1 * | 11/2005 | Chang | 313/498 |
| 2005/0274970 A1 | 12/2005 | Ludowise | |
| 2006/0012299 A1 | 1/2006 | Suehiro et al. | |
| 2006/0043401 A1 | 3/2006 | Lee et al. | |
| 2006/0044864 A1 | 3/2006 | Lin et al. | |
| 2006/0103012 A1 | 5/2006 | Chin | |
| 2006/0131599 A1 | 6/2006 | Slater, Jr. et al. | |
| 2006/0133044 A1 | 6/2006 | Kim et al. | |
| 2006/0138443 A1 | 6/2006 | Zhaoyang et al. | |
| 2006/0163596 A1 | 7/2006 | Kim et al. | |
| 2006/0169993 A1 | 8/2006 | Fan et al. | |
| 2006/0183625 A1 | 8/2006 | Miyahara | |
| 2006/0202223 A1 | 9/2006 | Sackrison et al. | |
| 2006/0202225 A1 | 9/2006 | Kim et al. | |
| 2006/0261364 A1 * | 11/2006 | Suehiro et al. | 257/100 |
| 2007/0063209 A1 | 3/2007 | Sugiura et al. | |
| 2007/0072324 A1 | 3/2007 | Krames et al. | |
| 2007/0257344 A1 | 11/2007 | Chen et al. | |
| 2007/0257901 A1 | 11/2007 | Gotou et al. | |
| 2007/0273299 A1 | 11/2007 | Miskin et al. | |
| 2008/0087902 A1 | 4/2008 | Lee et al. | |
| 2009/0167202 A1 | 7/2009 | Miskin et al. | |
| 2009/0267085 A1 | 10/2009 | Lee et al. | |
| 2009/0272971 A1 | 11/2009 | Lee et al. | |
| 2010/0072905 A1 | 3/2010 | Kim et al. | |
| 2010/0193808 A1 | 8/2010 | Lee et al. | |
| 2010/0224904 A1 | 9/2010 | Lee et al. | |
| 2010/0244060 A1 | 9/2010 | Lee et al. | |
| 2011/0140135 A1 | 6/2011 | Lee et al. | |
| 2011/0175128 A1 | 7/2011 | Lee et al. | |
| 2011/0175129 A1 | 7/2011 | Lee et al. | |
| 2011/0233574 A1 | 9/2011 | Lee et al. | |
| 2011/0241054 A1 | 10/2011 | Lee et al. | |

FOREIGN PATENT DOCUMENTS

| | | |
|---|---|---|
| DE | 102006049081 | 4/2008 |
| EP | 1267424 | 12/2002 |
| EP | 1439587 | 7/2004 |
| EP | 1 469 529 | 10/2004 |
| JP | 62-89455 | 12/1988 |
| JP | 04-010671 | 1/1992 |
| JP | 05-152610 | 6/1993 |
| JP | 5198843 | 8/1993 |
| JP | 3-87335 | 2/1994 |
| JP | 08-064872 | 3/1996 |
| JP | 09-181394 | 7/1997 |
| JP | 10-107316 | 4/1998 |
| JP | 10-190069 | 7/1998 |
| JP | 10-247750 | 9/1998 |
| JP | 10-305620 | 11/1998 |
| JP | 11-150303 | 6/1999 |
| JP | 11-161197 | 6/1999 |
| JP | 11220179 | 8/1999 |
| JP | 11-330131 | 11/1999 |
| JP | 11-346008 | 12/1999 |
| JP | 2000-049374 | 2/2000 |
| JP | 2000-049415 | 2/2000 |
| JP | 2001-217467 | 8/2001 |
| JP | 2001-307506 | 11/2001 |
| JP | 2002-050797 | 12/2001 |
| JP | 2002-094122 | 3/2002 |
| JP | 2002076443 | 3/2002 |
| JP | 2002111068 | 4/2002 |
| JP | 2002-170999 | 6/2002 |
| JP | 2002-203989 | 7/2002 |

(56) References Cited

FOREIGN PATENT DOCUMENTS

| | | |
|---|---|---|
| JP | 2002-335010 | 11/2002 |
| JP | 2002-359402 | 12/2002 |
| JP | 2003-008083 | 1/2003 |
| JP | 2003-031850 | 1/2003 |
| JP | 2003-046133 | 2/2003 |
| JP | 2003060238 | 2/2003 |
| JP | 2003-092011 | 3/2003 |
| JP | 2003-110148 | 4/2003 |
| JP | 2003-152225 | 5/2003 |
| JP | 2003188418 | 7/2003 |
| JP | 2003218397 | 7/2003 |
| JP | 2003332634 | 11/2003 |
| JP | 2004-006582 | 1/2004 |
| JP | 2004-023099 | 1/2004 |
| JP | 2004-214478 | 7/2004 |
| JP | 2004-521506 | 7/2004 |
| JP | 2004-221598 | 8/2004 |
| JP | 2004-241401 | 8/2004 |
| JP | 2004-282065 | 10/2004 |
| JP | 2004-319685 | 11/2004 |
| JP | 2004-327863 | 11/2004 |
| JP | 2004-335740 | 11/2004 |
| JP | 2004320024 | 11/2004 |
| JP | 2004-363454 | 12/2004 |
| JP | 2005-019997 | 1/2005 |
| JP | 2005-056885 | 3/2005 |
| JP | 2005-064047 | 3/2005 |
| JP | 2008-533716 | 8/2008 |
| JP | 2002-118293 | 10/2010 |
| JP | 2004-241729 | 11/2010 |
| KR | 10-2001-0114224 | 12/2001 |
| KR | 10-2006-0001800 | 1/2006 |
| KR | 10-2006-0087620 | 8/2006 |
| WO | 02/084749 | 10/2002 |
| WO | 2004/005216 | 1/2004 |
| WO | 2004/080236 | 9/2004 |
| WO | 2006/095949 | 9/2006 |

OTHER PUBLICATIONS

DE Office Action dated Feb. 4, 2009.
Final Office Action issued in co-pending U.S. Appl. No. 12/481,998 on Jun. 25, 2010.
Non-Final Office Action issued in co-pending U.S. Appl. No. 12/481,998 on Feb. 8, 2010.
Notice of Allowance issued in U.S. Appl. No. 11/721,803on Jan. 28, 2010.
Final Office Action issued in U.S. Appl. No. 11/721,803 on Jul. 9, 2009.
Non-Final Office Action issued co-pending U.S. Appl. No. 12/481,998 on Oct. 6, 2010.
Non-Final Office Action issued in U.S. Appl. No. 11/721,803 on Feb. 25, 2009.
Final Office Action of U.S Appl. No. 11/908,112 issued on Jan. 26, 2011.
Extended Search Report of EP05817646.2 issued on Nov. 30, 2010, corresponding to U.S. Appl. No. 11/908,112.
Final Office Action issued in U.S. Appl. No. 11/908,112 on Jan. 26, 2011.
Notice of Allowance issued in U.S. Appl. No. 11/908,112 on Oct. 5, 2011.
Final Office Action issued in U.S. Appl. No. 13/074,740 on Nov. 3, 2011.
Written Opinion of PCT/KR2005/003555 mailed on Feb. 6, 2006.
International Search Report of PCT/KR2005/003555 mailed on Feb. 6, 2006.
Non-Final Office Action of U.S. Appl. No. 13/074,761 on Jun. 24, 2011.
Preliminary Notice of the first office action of Taiwanese Patent Application No. 094142818 dated on Dec. 28, 2010.
Non-Final Office Action of U.S. Appl. No. 12/481,998 dated on Jul. 8, 2011.
Non-Final Office Action of U.S. Appl. No. 13/152,566 dated on Jul. 13, 2011.
Final Office Action issued of U.S. Appl. No. 12/481,998 dated on Oct. 27, 2011.
Notice of Allowance of U.S. Appl. No. 12/766,656 dated on Oct. 15, 2010.
Notice of Allowance of U.S. Appl. No. 12/819,154 dated on Oct. 6, 2010.
Final Office Action of U.S. Appl. No. 13/159,846 dated on Nov. 18, 2011.
Non-Final Office Action for U.S. Appl. No. 13/074,740 issued on Jul. 19, 2011.
U.S. Office Action dated Apr. 26, 2011 (from co-pending U.S. Appl. No. 11/908,112).
Final Office Action of U.S. Appl. No. 12/782,287 dated on Jul. 5, 2012.
Non-Final Office Action of U.S. Appl. No. 13/074,761 on Jan. 6, 2012.
Non-Final Office Action of U.S. Appl. No. 12/782,287 dated Jan. 5, 2012.
Notice of Allowance of U.S. Appl. No. 13/159,846 dated Mar. 5, 2012.
Non-Final Office Action of U.S. Appl. No. 13/296,735 dated Mar. 15, 2012.
Notice of Allowance of U.S. Appl. No. 12/481,998 dated Mar. 19, 2012.
Notice of Allowance of U.S. Appl. No. 13/239,132 dated Apr. 3, 2012.
Non-Final Office Action of U.S. Appl. No. 13/152,566 dated Jun. 8, 2012.
Final Office Action issued to related U.S. Appl. No. 13/152,566 dated Oct. 3, 2012.
Final Office Action of U.S. Appl. No. 13/074,761 dated on Jul. 31, 2012.
Final Office Action of U.S. Appl. No. 13/296,735 dated on Aug. 14, 2012.
Notice of Allowance dated Oct. 9, 2012 issued to related U.S. Appl. No. 12/782,287.
Non-Final Office Action dated Oct. 17, 2012 issued to related U.S. Appl. No. 13/074,761.
Notice of Allowance dated Oct. 24, 2012 issued to related U.S. Appl. No. 13/074,740.
Non-Final Office Action dated Nov. 9, 2012 issued to related U.S. Appl. No. 13/296,735.
Notice of Allowance dated May 30, 2013 issued to U.S. Appl. No. 13/152,566.
Notice of Allowance issued on Jul. 31, 2013 in U.S. Appl. No. 13/296,735.
Non-Final Office Action issued on Aug. 5, 2013 in U.S. Appl. No. 13/341,659.
Notice of Allowance issued on Oct. 2, 2013 in U.S. Appl. No. 13/074,761.
Final Office Action issued Jun. 12, 2014, in U.S. Appl. No. 13/341,659.
Advisory Action issued in U.S. Appl. No. 11/721,803 on Oct. 19, 2009.
Accelerated Examination Support Document filed in U.S. Appl. No. 12/766,656 on Apr. 23, 2010.
Accelerated Examination Support Document filed in U.S. Appl. No. 12/819,154 on Jun. 18, 2010.

* cited by examiner

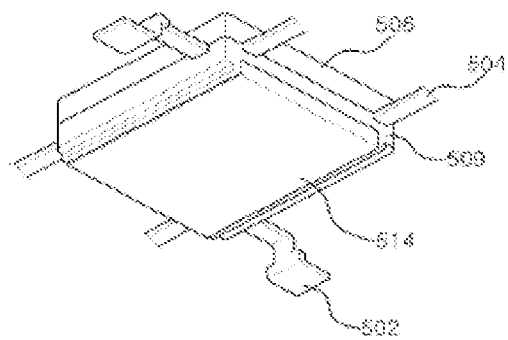
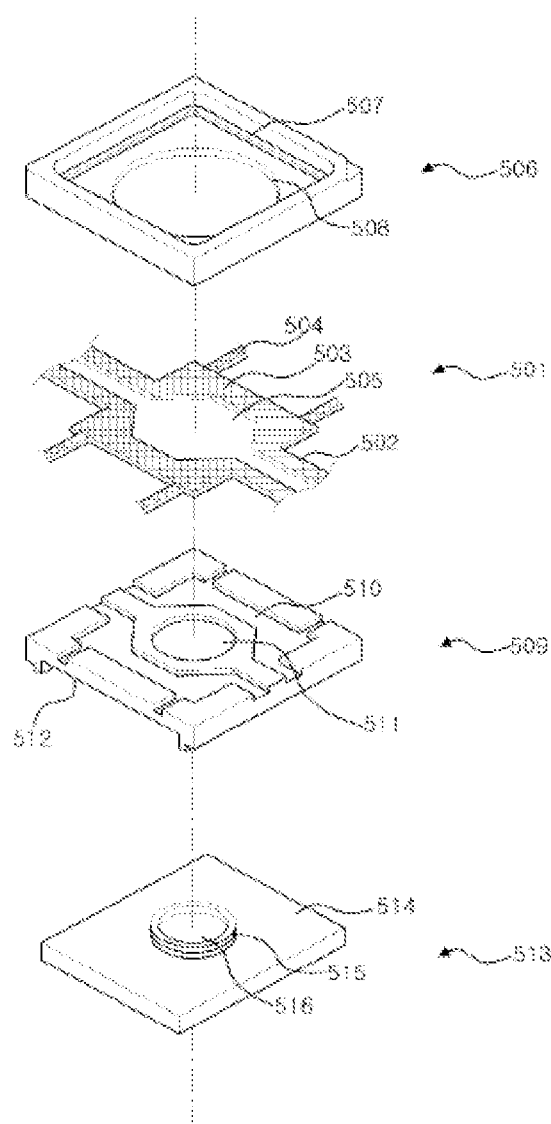

LED PACKAGE HAVING AN ARRAY OF LIGHT EMITTING CELLS COUPLED IN SERIES

CROSS-REFERENCE TO RELATED APPLICATIONS

This application is a continuation of U.S. patent application Ser. No. 11/908,112, filed on Sep. 7, 2007, which is the National Stage of PCT/KR2005/003565, filed on Oct. 26, 2005 and claims priority from and the benefit of Korean Patent Application No. 10-2005-0026090, filed on Mar. 29, 2005; Korean Patent Application No. 10-2005-026078, filed on Mar. 29, 2005, Korean Patent Application No. 10-2005-0026067, filed on Mar. 29, 2005; Korean Patent Application No. 10-2005-0026108, filed on Mar. 29, 2005; and Korean Patent Application No. 10-2005-0020377, filed on Mar. 11, 2005 which are all hereby incorporated by reference for all purposes as if fully set forth herein.

TECHNICAL FIELD

The present invention relates to a light emitting diode (LED) package, and more particularly, to an LED package having an array of light emitting cells coupled in series, which can be directly connected to and driven by an AC power source.

BACKGROUND ART

Since light emitting diodes (LEDs) can realize colors, they have been widely used for indicating lamps, electric display boards and displays. The LEDs have also been used for general illumination because they can realize white light. Since such LEDs have high efficiency and longer life span and are environment-friendly, their applicable fields have been continuously expanded.

Meanwhile, an LED is a semiconductor device which is formed of a p-n junction structure of semiconductors and emits light through recombination of electrons and holes. In general, the LED is driven by a current flowing in a direction. Thus, when the LED is driven using an AC power source, there is a need for an AC/DC converter for converting an AC current to a DC current. With the use of an AC/DC converter together with LEDs, installation costs of LEDs increase, which makes it difficult to use the LEDs for general illumination at home. Therefore, to use LEDs for general illumination, there is a need for an LED package capable of being directly driven using an AC power source without an AC/DC converter.

Such an LED lamp is disclosed in U.S. Pat. No. 5,463,280 entitled "LIGHT EMITTING DIODE RETROFIT LAMP" issued to James C. Johnson. The LED lamp includes a plurality of light emitting diodes coupled in series, a means for limiting a current, and a diode bridge. Since an AC current is converted to a DC current through the diode bridge, the LED lamp can be driven by an AC power source.

However, since the LED lamp have serially coupled LEDs with individual LED chips mounted thereon, the process of coupling the LEDs is complicated, and the size of the LED lamp considerably increases since the LEDs occupy a large space.

In the meantime, since the luminous power of an LED is substantially in proportion to an input power, increase of electric power to be input into the LED enables high luminous power. However, the junction temperature of the LED increases due to the increase of the input electric power. The increase of the junction temperature of the LED results in decrease of photometric efficiency that represents the degree of conversion of input energy into visual light. Therefore, it is necessary to prevent the junction temperature of the LED from rising due to the increased input power.

Technical Problem

An object of the present invention is to provide a light emitting diode (LED) package, which can be driven using an AC power source without an external AC/DC converter and thus can be miniaturized.

Another object of the present invention is to provide an LED package of which fabricating processes can be simplified and which is advantageous to mass production.

A further object of the present invention is to provide an LED package, which can improve photometric efficiency by easily dissipating generated heat and has a stable structure.

Technical Solution

In order to achieve these objects of the present invention, the present invention provides an LED package having an array of light emitting cells coupled in series. An LED package according to an aspect of the present invention comprises a package body, and an LED chip mounted on the package body. The LED chip has an array of light emitting cells coupled in series. Since the LED package according to this aspect of the present invention mounts the LED chip having the array of light emitting cells coupled in series thereon, it can be driven directly using an AC power source.

Here, the term "light emitting cell" means a minute LED formed in a single LED chip. Although an LED chip generally has only one LED, the LED chip of the present invention has a plurality of light emitting cells.

In embodiments of the present invention, the LED chip comprises a substrate and a plurality of light emitting cells formed on the substrate. The light emitting cells are electrically insulated from the substrate.

In some embodiments of the present invention, the LED chip may comprise wires for electrically connecting the light emitting cells to one another in series. The array of light emitting cells coupled in series is formed by the light emitting cells and the wires.

In other embodiments of the present invention, a submount may be interposed between the LED chip and the package body. The submount may have electrode patterns corresponding to the light emitting cells, and the electrode patterns may couple the light emitting cells to one another in series. As a result, the array of light emitting cells coupled in series is formed by the light emitting cells and the electrode patterns.

Further, the LED chip may further comprise a rectification bridge unit for applying predetermined rectified power to the array of light emitting cells coupled in series. Accordingly, the LED chip can be driven using an AC power source.

Meanwhile, the LED chip may further comprise one or more arrays of light emitting cells coupled in series. The arrays of light emitting cells coupled in series may be connected to one another in reverse parallel. Accordingly, the LED chip can be driven using an AC power source without a rectification bridge unit or an AC/DC converter.

An encapsulant and/or a molding member may encapsulate the LED chip. The encapsulant and/or molding member protect the LED chip against moisture or external forces. The terms "encapsulant" and "molding member" herein are used without any differences from each other. However, in some embodiments, they are used together for discriminately referring to components.

Meanwhile, the LED package may further comprise a phosphor for converting the wavelength of light emitted from the LED chip. The phosphor may be incorporated in the molding member, or it may be located between the molding member and the LED chip, or on the molding member. With appropriate selection of the phosphor, it is possible to provide a LED package that can realize light with various colors or white light.

Meanwhile, the package body may have various structures.

For example, the package body may be a printed circuit board (PCB) with lead electrodes. The LED chip is electrically connected to the lead electrodes. In addition thereto, a reflective portion may be located on the PCB to reflect light emitted from the LED chip and incident thereon.

Moreover, the LED package may further comprise a pair of lead frames spaced apart from each other, and a heat sink. The package body supports the pair of lead frames and the heat sink. The package body may have an opening for exposing a portion of each of the lead frames and an upper portion of the heat sink. Meanwhile, the LED chip is mounted on the heat sink. By employing the heat sink, heat generated from the LED chip can be easily dissipated.

In some embodiments of the present invention, the heat sink may be connected directly to one of the lead frames at a side surface thereof and spaced apart from the other of the lead frames. Accordingly, the heat sink can be prevented from being separated from a package body, thereby providing an LED package that is stable in view of its structure.

In addition thereto, the heat sink may comprise a base and a protrusion protruding upwardly at a central portion of the base. Accordingly, the area of a heat dissipation surface increases so that heat can be easily dissipated and the size of an LED package can be minimized as well. The protrusion may protrude beyond a top surface of the package body.

Further, the heat sink may have a lead frame-receiving groove for receiving one of the lead frames at a side surface of the protrusion. The directly connected lead frame may be inserted into the lead frame-receiving groove. On the contrary, the heat sink and the lead frame connected directly to the heat sink may be formed integrally with each other.

In other embodiments of the present invention, the package body has a through-hole exposed through the opening. Further, the pair of lead frames have a pair of inner frames exposed inside the opening of the package body, and outer frames extending from the respective inner frames and protruding to the outside of the package body. In addition thereto, the heat sink is combined with a lower portion of the package body through the through-hole.

In addition, the heat sink may comprise a base combined with the lower portion of the package body, and a protrusion protruding upwardly at a central portion of the base and coupled with the through-hole. Further, the heat sink may have a latching step at a side surface of the protrusion. The latching step is caught by an upper surface of the package body or inserted into a sidewall defining the through-hole so that the heat sink is prevented from being separated from the package body.

According to another aspect of the present invention, there is provided an LED lamp on which an LED chip with an array of light emitting cells coupled in series is mounted. The LED lamp comprises a first lead having a top portion and a pin-type or snap-type leg extending from the top portion, and a second lead arranged to be spaced apart from the first lead and having a pin-type or snap-type leg corresponding to the first lead. The LED chip with the array of light emitting cells coupled in series is mounted on the top portion. Meanwhile, bonding wires electrically connect the LED chip to the first lead and the second lead, respectively. In addition, a molding member encapsulates the top portion of the first lead, the LED chip and a portion of the second lead. According to this aspect, by mounting the LED chip with the array of light emitting cells coupled in series, it is possible to provide an LED lamp that can be driven using an AC power source without an AC/DC converter.

The top portion of the first lead may have a cavity, and the LED chip may be mounted inside the cavity.

Meanwhile, if the first and second leads have pin-type legs, each of the first and second leads may have two pin-type legs. Such an LED lamp is generally known as a high flux LED lamp. Thus, according to this aspect, it is possible to provide a high flux LED lamp which can be driven using an AC power source.

Furthermore, a heat sink may extend from the top portion of the first lead in parallel with the leg of the first lead. The heat sink easily dissipates heat generated from the LED chip, thereby improving the photometric efficiency of the LED lamp. Further, the heat sink may have grooves on the surface thereof. The grooves increase the surface area of the heat sink, thereby more enhancing heat dissipation performance.

In embodiments of this aspect, the LED chip comprises a substrate and a plurality of light emitting cells formed on the substrate. The light emitting cells are electrically insulated from the substrate.

In some embodiments of this aspect, the LED chip may comprise wires for connecting the light emitting cells to one another in series.

In other embodiments of this aspect, a submount may be interposed between the LED chip and the top portion. The submount may have electrode patterns corresponding to the light emitting cells, and the electrode patterns may connect light emitting cells to one another in series.

Meanwhile, the LED chip may further comprises a rectification bridge unit for applying predetermined rectified power to the array of light emitting cells coupled in series.

Further, the LED chip may further comprise one or more arrays of light emitting cells coupled in series. The arrays of light emitting cells coupled in series may be connected to one another in reverse parallel.

Meanwhile, the LED lamp may further comprise a phosphor for converting the wavelength of light emitted from the LED chip. The phosphor may be dispersed in the molding member, or may be located between the molding member and the LED chip or on the molding member.

According to a further aspect of the present invention, there is provided an LED package having light emitting cells coupled in series. The LED package comprises a package body. A submount with electrode patterns is mounted on the package body. Meanwhile, the light emitting cells are bonded to the electrode patterns of the submount. At this time, the light emitting cells are coupled to one another in series through the electrode patterns. In addition thereto, a molding member may encapsulate the light emitting cells.

The package body may be a printed circuit board with lead electrodes, and the submount may be electrically connected to the lead electrodes.

Meanwhile, the LED package according to this aspect may further comprise a pair of lead frames spaced apart from each other, and a heat sink. The package body supports the pair of lead frames and the heat sink, and it may have an opening for exposing a portion of each of the lead frames and an upper portion of the heat sink. Further, the submount may be mounted on the heat sink.

According to a still further aspect of the present invention, there is provided an LED lamp having an array of light emitting cells coupled in series. The LED lamp comprises a first lead having a top portion and a pin-type or snap-type leg extending from the top portion, and a second lead arranged to be spaced apart from the first lead and having a pin-type or snap-type leg corresponding to the first lead. Meanwhile, a submount with electrode patterns is mounted on the top portion. In addition thereto, the light emitting cells are bonded to the electrode patterns of the submount. At this time, the light emitting cells are coupled to one another in series through the electrode patterns. Further, bonding wires electrically connect the submount to the first and second leads, respectively. Meanwhile, a molding member encapsulates the top portion of the first lead, the light emitting cells and a portion of the second lead.

Advantageous Effects

According to the present invention, it is possible to provide an LED package and an LED lamp, which can be driven using an AC power source without an external AC/DC converter and thus can be miniaturized. Further, since light emitting cells formed on a single substrate are employed, the process of fabricating a package can be simplified and thus is advantageous to mass production. Moreover, since generated heat can be easily dissipated by employing the heat sink, the photometric efficiency of the light emitting cells can be improved. Furthermore, since the heat sink can be prevented from being separated from the package body, it is possible to provide an LED package that is stable in view of its structure.

DESCRIPTION OF DRAWINGS

FIGS. 19 to 23 are views illustrating LED packages each of which employs a heat sink, according to further embodiments of the present invention.

BEST MODE

Figure 1:
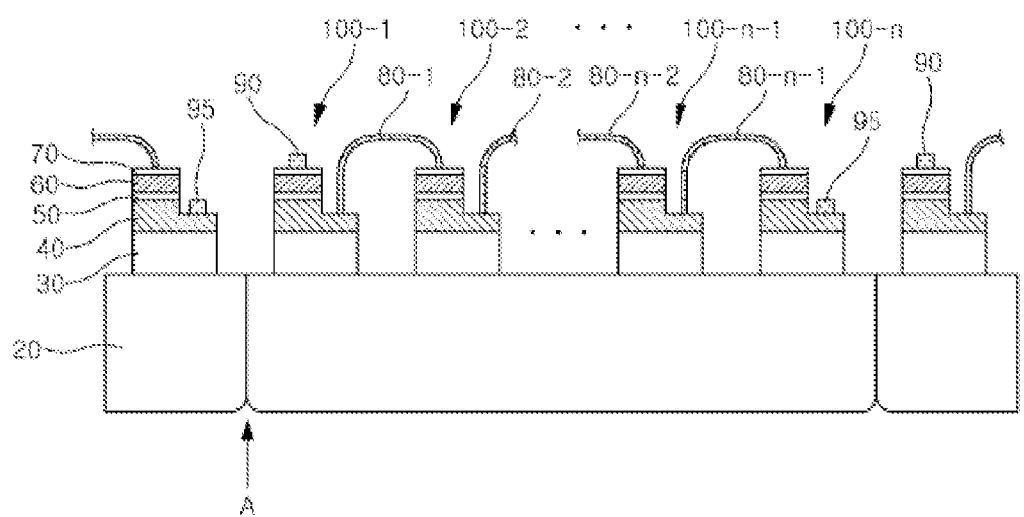
FIGS. 1 and 2 are sectional views illustrating light emitting diode (LED) chips each of which has an array of light emitting cells coupled in series, which are applicable to embodiments of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

<Array of Light Emitting Cells Coupled in Series>

Figure 2:
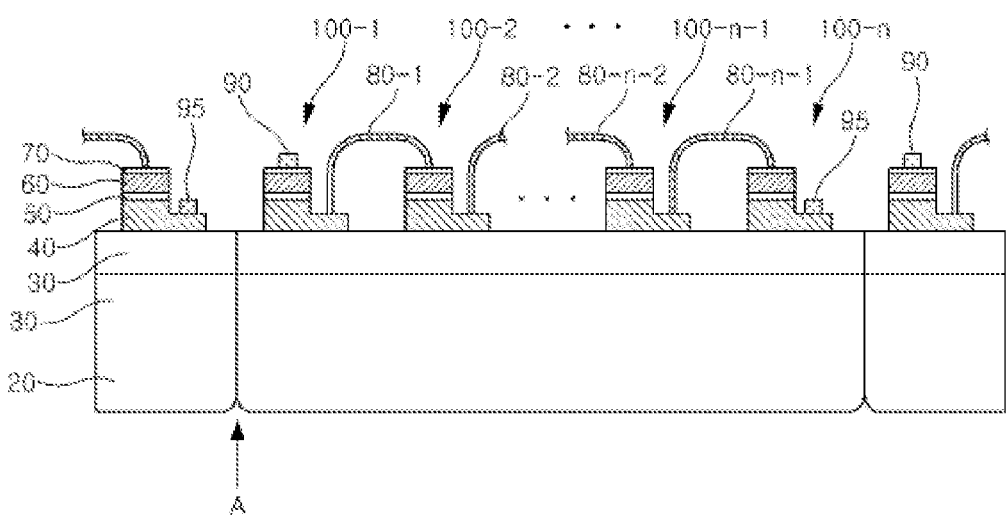
Figure 3:
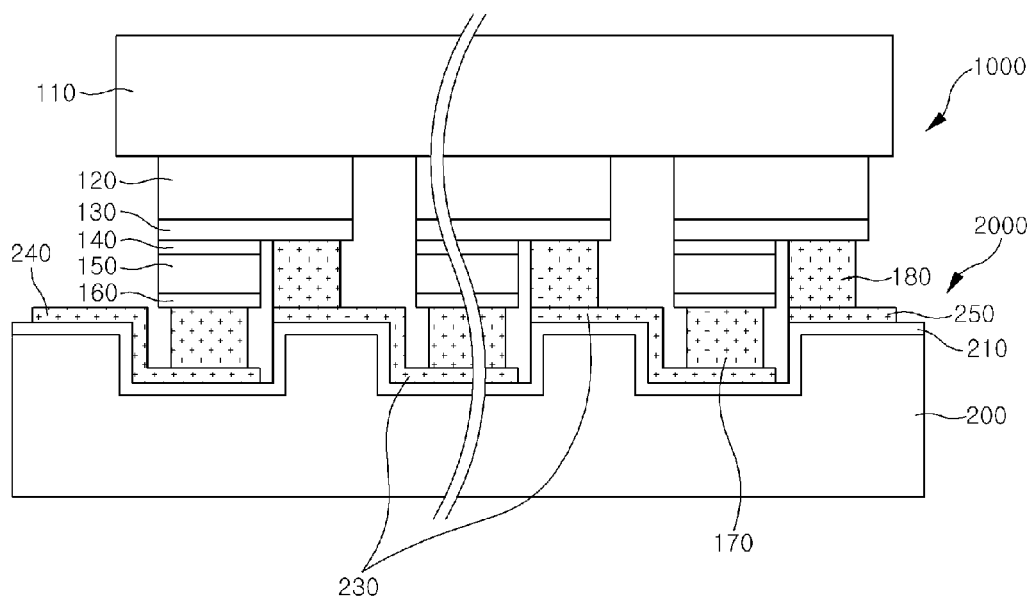
FIGS. 3 to 5 are sectional views illustrating arrays of light emitting cells coupled in series through electrode patterns of a submount, which are applicable to embodiments of the present invention.
Figure 4:
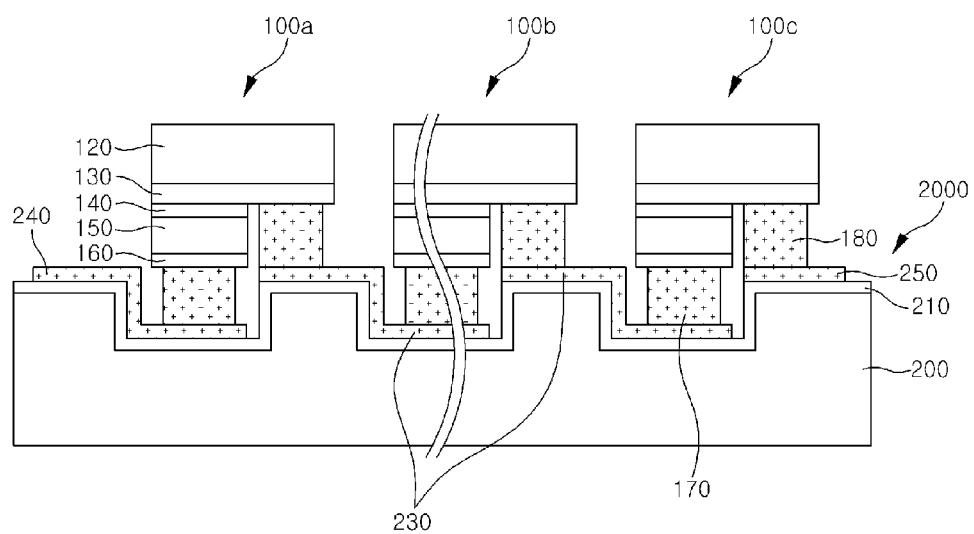
Figure 5:
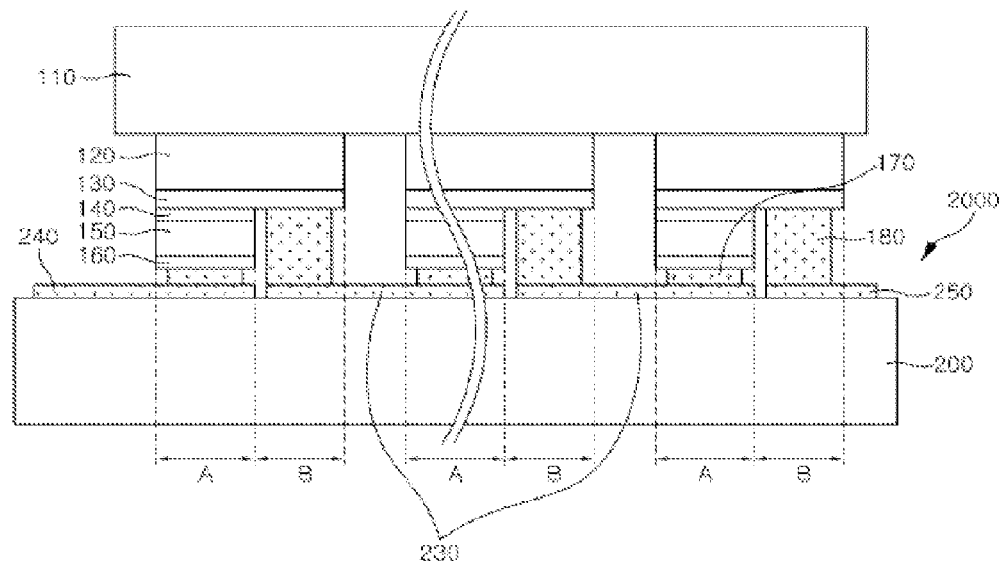

A light emitting diode (LED) package according to the present invention includes an array of light emitting cells coupled in series. FIGS. 1 to 5 are sectional views illustrating arrays of light emitting cells coupled in series, which are applicable to embodiments of the present invention. Here, FIGS. 1 and 2 are sectional views illustrating LED chips each of which has an array of light emitting cells coupled in series through wires, FIGS. 3 and 5 are sectional views illustrating LED chips each of which has an array of light emitting cells coupled in series through electrode patterns of a submount, and FIG. 4 is a sectional view illustrating an array of light emitting cells coupled in series through electrode patterns of a submount.

Referring to FIGS. 1 and 2, an LED chip of the present invention is formed on a substrate 20 and has a plurality of light emitting cells 100-1 to 100-*n* coupled to one another in series through wires 80-1 to 80-*n*. That is, the LED chip comprises the plurality of light emitting cells 100 in which N-type semiconductor layers 40 and P-type semiconductor layers 60 of the adjacent light emitting cells 100-1 to 100-*n* are electrically connected, an N-type pad 95 is formed on the N-type semiconductor layer 40 of a light emitting cell 100-*n* located at one end of the LED chip, and a P-type pad 90 is formed on the P-type semiconductor layer 60 of a light emitting cell 100-1 located at the other end thereof.

The N-type semiconductor layers 40 and the P-type semiconductor layers 60 of the adjacent light emitting cells 100-1 to 100-*n* are electrically connected to each other through the metal wires 80 to form an array of the light emitting cells coupled in series. The light emitting cells 100-1 to 100-*n* can be coupled in series as many as the number of light emitting cells that can be driven by an AC power source. In the present invention, the number of the light emitting cells 100 coupled in series is selected according to a voltage/current for driving a single light emitting cell 100 and an AC driving voltage applied to an LED chip for illumination.

In the LED chip with first to n-th light emitting cells 100-1 to 100-*n* coupled in series, as shown in FIG. 1, the P-type pad 90 is formed on the P-type semiconductor layer 60 of the first light emitting cell 100-1, and the N-type semiconductor layer 40 of the first light emitting cell 100-1 and the P-type semiconductor layer 60 of the second light emitting cell 100-2 are connected through a first wire 80-1. Further, the N-type semiconductor layer 40 of the second light emitting cell 100-2 and the P-type semiconductor layer (not shown) of the third light emitting cell (not shown) are connected through a second wire 80-2. An N-type semiconductor layer (not shown) of the (n−2)-th light emitting cell (not shown) and a P-type semiconductor layer 60 of the (n−1)-th light emitting cell 100-n−1 are connected through an (n−2)-th wire 80-n−2, and an N-type semiconductor layer 40 of the (n−1)-th light emitting cell 100-n−1 and a P-type semiconductor layer 60 of the n-th light emitting cell 100-n are connected through an (n−1)-th wire 80-n−1. Further, the N-type pad 95 is formed on the N-type semiconductor layer 40 of the n-th light emitting cell 100-n.

The substrate 20 in the present invention may be a substrate on which a plurality of LED chips can be fabricated. Here, positions designated by "A" as shown in FIGS. 1 and 2 refer to cutting positions for cutting the substrate into discrete LED chips.

Further, the aforementioned LED chip may have rectification diode cells for rectifying an external AC voltage. The diode cells are connected in the form of a rectification bridge to form a bridge rectifier. The bridge rectifier is arranged between an external power source and the array of light emitting cells coupled in series. Accordingly, a current flowing in a certain direction is supplied to the array of light emitting cells coupled in series. The rectification diode cells may have the same structures as those of the light emitting cells. In other words, the rectification diode cells may be formed through the same process as the light emitting cells.

Meanwhile, at least two arrays of light emitting cells coupled in series may be formed on the substrate. The arrays may be connected in reverse parallel to each other to be alternately driven by an AC power source.

A method of fabricating an LED chip having the light emitting cells coupled in series will be described below.

A buffer layer 30, an N-type semiconductor layer 40, an active layer 50 and a P-type semiconductor layer 60 are sequentially grown on a substrate 20. A transparent electrode layer 70 may further be formed on the P-type semiconductor layer 60. The substrate 20 may be a substrate made of sapphire (Al.sub.2O.sub.3), silicon carbide (SiC), zinc oxide (ZnO), silicon (Si), gallium arsenide (GaAs), gallium phosphide (GaP), lithium-alumina (LiAl.sub.2O.sub.3), boron nitride (BN), aluminum nitride (AlN) or gallium nitride (GaN), and the substrate 20 may be selected depending on the material of a semiconductor layer formed thereon. The substrate 20 may be a sapphire substrate or a silicon carbide (SiC) substrate in a case where a GaN based semiconductor layer is formed thereon.

The buffer layer 30 is a layer for reducing the lattice mismatch between the substrate 20 and the subsequent layers upon growth of crystals, and may be, for example, a GaN film. It is preferred that the buffer layer 30 is formed of an insulating layer in a case where a SiC substrate is a conductive substrate, and it may be formed of a semi-insulating GaN. The N-type semiconductor layer 40 is a layer in which electrons are produced and may be formed of an N-type compound semiconductor layer and an N-type cladding layer. At this time, the N-type compound semiconductor layer may be made of GaN doped with N-type impurities. The P-type semiconductor layer 60 is a layer in which holes are produced and may be formed of a P-type cladding layer and a P-type compound semiconductor layer. At this time, the P-type compound semiconductor layer may be made of AlGaN doped with P-type impurities.

The active layer 50 is a region in which a predetermined band gap and a quantum well are formed so that electrons and holes are recombined, and may include an InGaN layer. Further, the wavelength of emitted light, which is generated due to the recombination of an electron and a hole, varies depending on the kind of a material constituting the active layer 50. Therefore, it is preferred that a semiconductor material comprised in the active layer 50 be controlled depending on a target wavelength.

Thereafter, the P-type semiconductor layer 60 and the active layer 50 are patterned such that a portion of the N-type semiconductor layer 40 is exposed, using lithographic and etching techniques. Also, the exposed portion of the N-type semiconductor layer 40 is partially removed to electrically isolate the light emitting cells 100 from each other. At this time, as shown in FIG. 1, a top surface of the substrate 20 may be exposed by removing an exposed portion of the buffer layer 30, or the etching may be stopped at the buffer layer 30. In a case where the buffer layer 30 is conductive, the exposed portion of the buffer layer 30 is removed to electrically isolate the light emitting cells.

By using the same process as the aforementioned fabricating process, diode cells for a rectification bridge may be formed at the same time. It will be apparent that diode cells for a rectification bridge may be separately formed through a typical semiconductor fabricating process.

Then, the conductive wires 80-1 to 80-n for electrically connecting the N-type semiconductor layers 40 and the P-type semiconductor layers 60 of the adjacent light emitting cells 100-1 to 100-n are formed through a predetermined process such as a bridge process or a step-cover process. The conductive wires 80-1 to 80-n are formed of a conductive material such as metal, silicon doped with impurities, or a silicon compound.

The bridge process is also referred to as an air bridge process, and this process will be described in brief. First, a photoresist is provided on a substrate having light emitting cells formed thereon, and a first photoresist pattern having openings for exposing the exposed portion of the N-type semiconductor layer and the electrode layer on the P-type semiconductor layer is then formed using an exposure technique. Thereafter, a metal material layer with a small thickness is formed using an e-beam evaporation technique or the like. The metal material layer is formed on entire top surfaces of the openings and photoresist pattern. Subsequently, a second photoresist pattern for exposing regions between the adjacent light emitting cells to be connected to one another as well as the metal material layer on the openings is formed again on the first photoresist pattern. Thereafter, gold is formed using a plating technique, and the first and second photoresist patterns are then removed. As a result, wires for connecting the adjacent light emitting cells to one another are left, and all the other metal material layers and photoresist patterns are removed so that the wires can connect the light emitting cells to one another in the form of bridges as shown in the figures.

Meanwhile, the step-cover process includes the step of forming an insulating layer on a substrate with light emitting cells. The insulating layer is patterned using lithographic and etching techniques to form openings for exposing the N-type semiconductor layer and the electrode layer on the P-type semiconductor layer. Subsequently, a metal layer for filling the openings and covering the insulating layer is formed using an e-beam evaporation technique or the like. Thereafter, the metal layer is patterned using lithographic and etching techniques to form wires for connecting the adjacent light emitting cells to one another. It is possible to make various modifications to such a step-cover process. Upon use of the step-cover process, the wires are supported by the insulating layer, thereby improving the reliability of the wires.

Meanwhile, the P-type pad 90 and the N-type pad 95 for electrical connection with the outside are formed on the light emitting cells 100-1 and 100-n located at both ends of the LED chip, respectively. Bonding wires (not shown) may be connected to the P-type pad 90 and N-type pad 95.

The aforementioned method of fabricating the LED chip of the present invention is only a specific embodiment and is not limited thereto. Various modifications and additions can be made thereto depending on features of a device and convenience of a process.

For example, a plurality of vertical light emitting cells each of which has an N-type electrode, an N-type semiconductor layer, an active layer, a P-type semiconductor layer and a P-type electrode sequentially laminated one above another are formed on a substrate, or light emitting cells having such a structure are arrayed by being bonded on the substrate. Then, the plurality of light emitting cells are coupled in series by connecting the N-type electrodes and P-type electrodes of the adjacent light emitting cells to one another, thereby fabricating an LED chip. It will be apparent that the vertical light emitting cell is not limited to the structure of the aforementioned example but may have various structures. Further, it is possible to form a plurality of light emitting cells on an additional host substrate by forming the plurality of light emitting cells on a substrate, bonding the light emitting cells on the host substrate, and separating the substrate using a laser or removing it using a chemical mechanical polishing technique. Thereafter, the adjacent light emitting cells can be coupled in series through wires.

Each of the light emitting cells 100 comprises the N-type semiconductor layer 40, the active layer 50 and the P-type semiconductor layer 60, which are sequentially laminated on a substrate 20, and the buffer layer 30 is interposed between the substrate 20 and the light emitting cell 100. Each of the light emitting cells 100 comprises the transparent electrode layer 70 formed on the P-type semiconductor layer 60. Further, in case of a vertical light emitting cell, it comprises an N-type electrode located beneath the N-type semiconductor layer.

The N-type pad and P-type pad are pads for use in electrically connecting the light emitting cell 100 to an external metal wire or bonding wire, and may be formed as a laminated structure of Ti/Au. Further, electrode pads for connection to the wires 80 may be formed on the P-type and N-type semiconductor layers of the light emitting cells 100. In addition, the aforementioned transparent electrode layer 70 distributes an input current such that the current is uniformly input into the P-type semiconductor layer 60.

The LED chip described with reference to FIGS. 1 and 2 has the array of light emitting cells 100 coupled in series through the wires 80. However, there are various methods of coupling the light emitting cells in series. For example, light emitting cells may be coupled in series using a submount. FIGS. 3 to 5 are sectional views illustrating arrays of light emitting cells coupled in series using submounts.

Referring to FIG. 3, an LED chip 1000 has a plurality of flip-chip type light emitting cells arrayed on a substrate 110. Each of the light emitting cells comprises an N-type semiconductor layer 130 formed on the substrate 110, an active layer 140 formed on a portion of the N-type semiconductor layer 130 and a P-type semiconductor layer 150 formed on the active layer 140. Meanwhile, a buffer layer 120 may be interposed between the substrate 110 and the light emitting cell. At this time, an additional P-type electrode layer 160 for reducing the contact resistance of the P-type semiconductor layer 150 may be formed on the P-type semiconductor layer 150. Although the P-type electrode layer may be a transparent electrode layer, it is not limited thereto. Moreover, the LED chip 1000 further comprises a P-type metal bumper 170 for bumping formed on the P-type electrode layer 150 and an N-type metal bumper 180 for bumping formed on the N-type semiconductor layer 130. Furthermore, a reflective layer (not shown) having a reflectivity of 10 to 100% may be formed on the top of the P-type electrode layer 160, and an additional ohmic metal layer for smooth supply of a current may be formed on the P-type semiconductor layer 150.

The substrate 110, the buffer layer 120, the N-type semiconductor layer 130, the active layer 140 and the P-type semiconductor layer 150 may be formed of the substrate 20 and the semiconductor layers described with reference to FIGS. 1 and 2.

A submount 2000 comprises a submount substrate 200 having a plurality of N-regions and P-regions defined thereon, a dielectric film 210 formed on the surface of the submount substrate 200, and a plurality of electrode patterns 230 for connecting adjacent N-region and P-region to each other. Further, the submount 2000 further comprises a P-type bonding pad 240 located at an edge of the substrate, and an N-type bonding pad 250 located at the other edge thereof.

The N-regions refer to regions to which the N-type metal bumpers 180 in the LED chip 1000 are connected, and the P-regions refer to regions to which the P-type metal bumpers 170 in the LED chip 1000 are connected.

At this time, a substrate with superior thermal conductivity is used as the submount substrate 200. For example, a substrate made of SiC, Si, germanium (Ge), silicon germanium (SiGe), AN, metal and the like can be used. The dielectric film 210 may be formed as a multi-layered film. In a case where the substrate is conductive, the dielectric film 210 may be omitted. The dielectric film 210 may be made of silicon oxide (SiO.sub.2), magnesium oxide (MgO) or silicon nitride (SiN).

The electrode pattern 230, the N-type bonding pad 250 and the P-type bonding pad 240 may be made of a metal with superior electrical conductivity.

A method of fabricating a submount substrate for an LED chip having flip-chip type light emitting cells constructed as above-mentioned will be described below.

Concave portions and convex portions are formed on the substrate 200 to define the N-regions and the P-regions thereon. The widths, heights and shapes of the N-regions and P-regions may be modified variously depending on the sizes of the N-type metal bumpers 180 and P-type metal bumpers 170 of the LED chip 1000 to be bonded thereon. In this embodiment, the convex portions of the substrate 200 become the N-regions, and the concave portions of the substrate 200 become the P-regions. The substrate 200 with such a shape may be fabricated using a mold or through a predetermined etching process. That is, a mask for exposing the P-regions is formed on the substrate 200, and exposed portions of the substrate 200 are then etched to form the recessed P-regions. Then, the mask is removed so that the recessed P-regions and the relatively protruding N-regions are formed. Alternatively, the recessed P-regions may be formed by means of machining.

Then, the dielectric film 210 is formed on the entire structure. At this time, the dielectric film 210 may not be formed in a case where the substrate 200 is not made of a conductive material. If a metal substrate with superior electrical conductivity is used to improve thermal conductivity, the dielectric film 210 is formed to function as a sufficient insulator.

The electrode patterns 230 each of which connects adjacent N-region and P-region in pair are formed on the dielectric film 210. The electrode patterns 230 may be formed through a screen printing method, or the electrode patterns 230 may be formed by patterning through lithographic and etching techniques after an electrode layer is deposited.

The P-type bumpers 170 of the LED chip 1000 are bonded to the electrode patterns 230 on the P-regions, and the N-type metal bumpers 180 thereof are bonded to the electrode patterns 230 on the N-regions so that the LED chip 1000 and the submount substrate 200 are bonded together. At this time, the light emitting cells of the LED chip 1000 are coupled in series through the electrode patterns 230 to form an array of light emitting cells coupled in series. The P-type bonding pad 240 and N-type bonding pad 250 located at both the ends of the array of light emitting cells coupled in series may be connected through bonding wires, respectively.

The metal bumpers 170 and 180, the electrode patterns 230, and the bonding pads 240 and 250 can be bonded through various bonding methods, e.g., a eutectic method using the eutectic temperature.

At this time, the number of the light emitting cells coupled in series can be variously modified depending on an electric power source to be used and power consumption of the light emitting cells.

Figure 34:
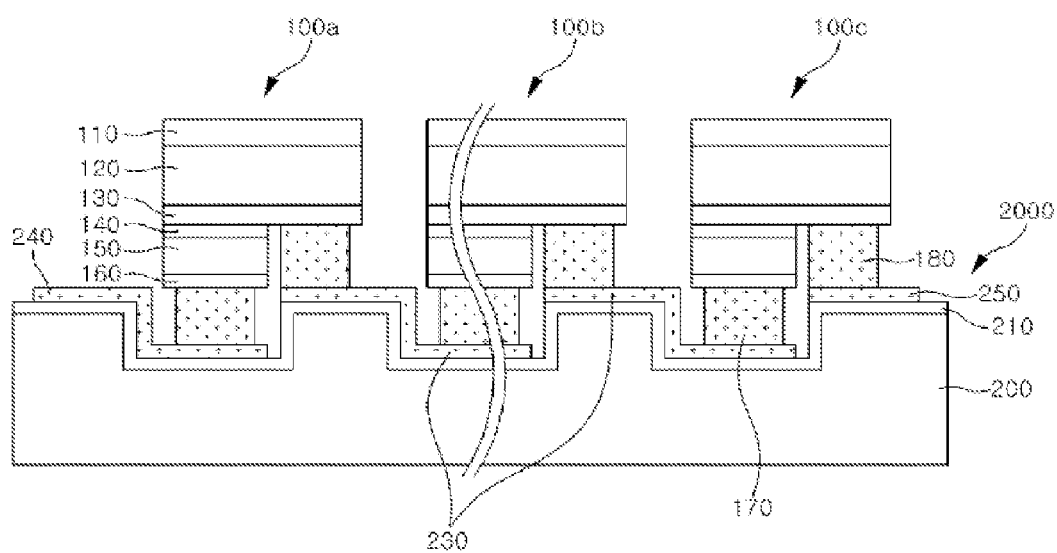

Referring to FIG. 4, the light emitting cells 100a to 100c are not arrayed on the substrate (110 in FIG. 3) but are bonded to the submount 200 while being separated from one another, as compared with the light emitting cells of FIG. 3. Such light emitting cells may be formed by separating the substrate 110 from the LED chip 1000 using a laser or by removing the substrate 110 using a chemical mechanical polishing technique, after bonding the LED chip 1000 on the submount 2000, as shown in FIG. 4. Alternatively, the light emitting cells 100a, 100b, and 100c can be fabricated by partially separating the substrate 110 from each of the light emitting cells, as shown in FIG. 34. At this time, the N-type metal bumpers 170 and the P-type metal bumpers 180 of adjacent light emitting cells 100a to 100c are bonded to the electrode patterns 230 formed on the submount 2000 so that the light emitting cells can be electrically coupled in series.

Figure 33:
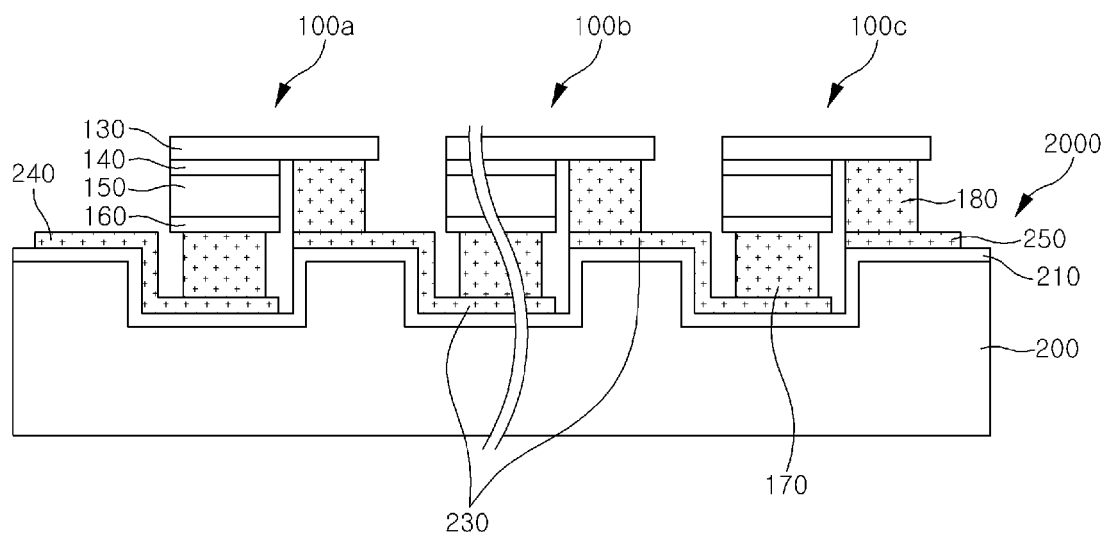
FIG. 33 and FIG. 34 are sectional views illustrating a light emitting device having a plurality of light emitting cells mounted on a submount substrate according to exemplary embodiments of the present invention.

In another exemplary embodiment of the present invention, as FIG. 33 shows, the light emitting cells 100a, 100b and 100c may be fabricated by separating the substrate 110 from the plurality of light emitting cells in the light emitting cell block 1000 of FIG. 3. In this case, however, the light emitting cell block 1000 is formed without the buffer layer 120.

Referring to FIG. 5, a flat substrate 200 with a plurality of N-regions and P-regions defined thereon is formed with electrode patterns 230 for connecting adjacent N-regions A and P-regions B, and an LED chip 1000 is then mounted on a submount 2000. That is, contrary to FIG. 3, the electrode patterns 230 are formed on the submount substrate 200 on which certain patterns, e.g., concave and convex portions, are not formed, and the N-type metal bumpers 180 and the P-type metal bumpers 170 of adjacent light emitting cells of the LED chip 1000 are bonded on the electrode patterns 230 to electrically connect the light emitting cells to one another. At this time, it is preferred that the N-type metal bumpers 180 and the P-type metal bumpers 170 be formed such that top surfaces thereof are located in the substantially same plane.

In these embodiments, although it has been illustrated that the P-type and N-type metal bumpers 170 and 180 are formed on the light emitting cells within the LED chip 1000, it is not limited thereto but the P-type and N-type metal bumpers 170 and 180 may be formed on the P-regions A and the N-regions B, respectively. At this time, certain metal electrodes (not shown) may be further formed on the N-type and P-type semiconductor layers 130 and 150 so as to be bonded to the metal bumpers 170 and 180.

Figure 6:
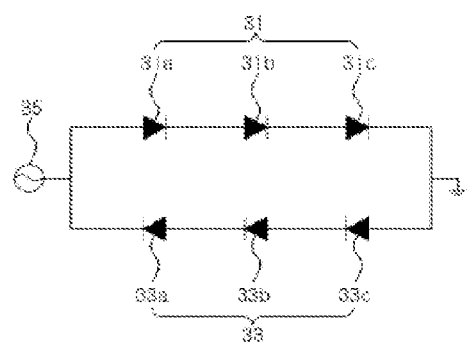
FIGS. 6 and 7 are circuit diagrams illustrating arrays of light emitting cells according to embodiments of the present invention.
Figure 7:
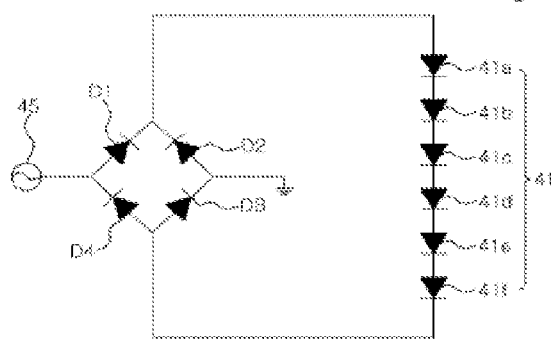

FIGS. 6 and 7 are circuit diagrams illustrating arrays of light emitting cells according to embodiments of the present invention.

Referring to FIG. 6, a first serial array 31 is formed by coupling light emitting cells 31a, 31b and 31c in series, and a second serial array 33 is formed by coupling other light emitting cells 33a, 33b and 33c in series. Here, the term "serial array" refers to an array of a plurality of light emitting cells coupled in series.

Both ends of each of the first and second serial arrays 31 and 33 are connected to an AC power source 35 and a ground, respectively. The first and second serial arrays are connected in reverse parallel between the AC power source 35 and the ground. That is, both ends of the first serial array are electrically connected to those of the second serial array, and the first and second serial arrays 31 and 33 are arranged such that their light emitting cells are driven by currents flowing in opposite directions. In other words, as shown in the figure, anodes and cathodes of the light emitting cells included in the first serial array 31 and anodes and cathodes of the light emitting cells included in the second array 33 are arranged in opposite directions.

Thus, if the AC power source 35 is in a positive phase, the light emitting cells included in the first serial array 31 are turned on to emit light, and the light emitting cells included in the second serial array 33 are turned off. On the contrary, if the AC power source 35 is in a negative phase, the light emitting cells included in the first serial array 31 are turned off, and the light emitting cells included in the second serial array 33 are turned on.

Consequently, the first and second serial arrays 31 and 33 are alternately turned on/off by the AC power source so that the light emitting chip including the first and second serial arrays can continue to emit light.

Although LED chips each of which comprises a single LED can be connected to one another to be driven by an AC power source as in the circuit of FIG. 6, space occupied by the LED chips are increased. However, in the LED chip of the present invention, a single chip can be driven by being connected to an AC power source, thereby preventing an increase in space occupied by the LED chip.

Meanwhile, although the circuit shown in FIG. 6 is configured such that the both ends of each of the first and second serial arrays are connected to the AC power source 35 and the ground, respectively, the circuit may be configured such that the both ends thereof are connected to both terminals of the AC power source. Further, although each of the first and second serial arrays comprises three light emitting cells, this is only an illustrative example for better understanding and the number of light emitting cells may be increased, if necessary. The number of serial arrays may also be increased.

Referring to FIG. 7, a serial array 41 comprises light emitting cells 41a, 41b, 41c, 41e and 41f. Meanwhile, a bridge rectifier including diode cells D1, D2, D3 and D4 is arranged between an AC power source 45 and the serial array 41, and between a ground and the serial array 41. Although the diode cells D1, D2, D3 and D4 may have the same structure as the light emitting cells, they are not limited thereto but may not emit light. An anode terminal of the serial array 41 is connected to a node between the diode cells D1 and D2, and a cathode terminal thereof is connected to a node between the diode cells D3 and D4. Meanwhile, a terminal of the AC power source 45 is connected to a node between the diode cells D1 and D4, and the ground is connected to a node between the diode cells D2 and D3.

If the AC power source 45 is in a positive phase, the diode cells D1 and D3 of the bridge rectifier are turned on, and the diode cells D2 and D4 thereof are turned off. Therefore, current flows to the ground via the diode cell D1 of the bridge rectifier, the serial array 41 and the diode cell D3 thereof.

Meanwhile, if the AC power source 45 is in a negative phase, the diode cells D1 and D3 of the bridge rectifier are turned off, and the diode cells D2 and D4 thereof are turned on. Therefore, current flows to the AC power source via the diode cell D2 of the bridge rectifier, the serial array 41 and the diode cell D4 thereof.

Consequently, the bridge rectifier is connected to the serial array 41 so that the serial array 41 can be continuously driven using the AC power source 45. Here, although the bridge rectifier is configured such that the terminals of the bridge rectifier are connected to the AC power source 45 and the ground, the bridge rectifier may be configured such that the both terminals are connected to both terminals of an AC power source. Meanwhile, as the serial array 41 is driven using the AC power source, a ripple may occur, and an RC filter (not shown) may be connected to prevent the occurrence of a ripple.

According to this embodiment, a single serial array may be driven by being electrically connected to an AC power source, and the light emitting cells can be effectively used as compared with the LED chip of FIG. 6.

LED packages or LED lamps with various structures may be provided by mounting an LED chip with the array of light emitting cells coupled in series or a submount having light emitting cells bonded thereto. LED packages or LED lamps with the array of light emitting cells coupled in series will be described in detail below.

Figure 8:
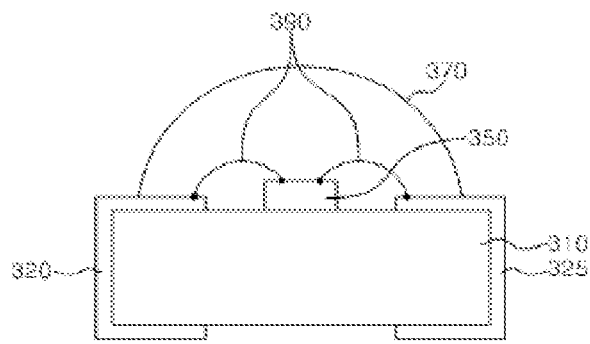
FIGS. 8 to 10 are sectional views illustrating LED packages according to embodiments of the present invention.
Figure 9:
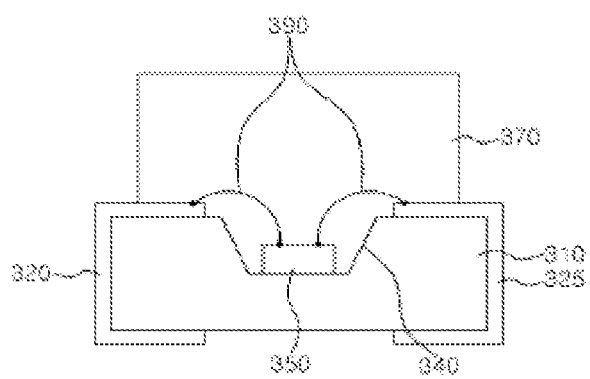
Figure 10:
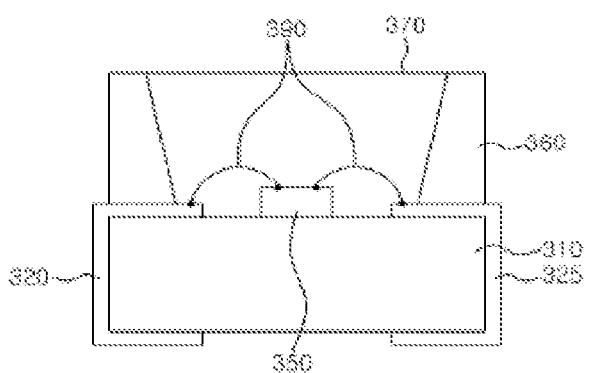

FIGS. 8 to 10 are sectional views illustrating LED packages according to embodiments of the present invention.

Referring to FIG. 8, the LED package comprises a substrate 310, electrodes 320 and 325 formed on the substrate 310, a light emitting device 350 mounted on the substrate 310 and a molding member 370 encapsulating the light emitting device 350.

The light emitting device 350 comprises an array of light emitting cells coupled in series through wires 80 as described with reference to FIGS. 1 and 2, or comprises a submount 2000 with the electrode patterns 250 and an array of light emitting cells coupled in series through the electrode patterns of the submount 2000 as described with reference to FIGS. 3 to 5. The light emitting device 350 comprises at least one array of light emitting cells, and may comprise at least two arrays of light emitting cells coupled in reverse parallel and/or an additional rectification bridge unit for a predetermined rectification operation.

Each of the light emitting cells comprises an N-type semiconductor layer and a P-type semiconductor layer, and the N-type semiconductor layer of one light emitting cell and the P-type semiconductor layer of another light emitting cell adjacent thereto are electrically connected to each other. Meanwhile, an N-type bonding pad and a P-type bonding pad may be formed to connect an external power source to one end and the other end of the array of light emitting cells coupled in series. In addition thereto, power source pads may be formed in the rectification bridge unit in a case where the light emitting device 350 includes the additional rectification bridge unit.

Since the light emitting cells are formed on a single substrate, it is possible to simplify a fabricating process and to reduce the size of a package as compared with a prior art in which respective light emitting diodes are mounted and then coupled in series.

The substrate 310 may be a printed circuit board with first and second lead electrodes 320 and 325 printed thereon. The lead electrodes 320 and 325 are electrically connected to the P-type bonding pad (90 in FIGS. 1 and 2, or 240 in FIGS. 3 to 5) and the N-type bonding pad (95 in FIGS. 1 and 2, or 250 in FIGS. 3 to 5), or the power source pads of the light emitting device 350, respectively.

The lead electrodes 320 and 325 may be formed using a printing technique or attached to the substrate 310 using an adhesive. The first and second electrodes 320 and 325 may be made of a metallic material containing copper or aluminum with superior conductivity and formed such that they are electrically separated from each other.

The lead electrodes 320 and 325, and the light emitting device 350 are electrically connected to one another through bonding wires 390. That is, the first electrode 320 and one pad of the light emitting device 350 are connected through one bonding wire 390, and the second electrode 325 and the other pad of the light emitting device 350 are connected through another bonding wire 390.

The molding member 370 may be formed by curing a thermosetting resin, e.g., an epoxy or silicone resin. The molding member 370 may be formed in various forms such as a lens, a hexahedron, a flat plate, a hemisphere or a cylinder and further include a plurality of small lens features on the top surface thereof.

Meanwhile, the LED package may further comprise a predetermined phosphor (not shown) for realizing light of a target color over the light emitting device 350. The phosphor may be applied on the light emitting device 350. Further, after the phosphor and the thermosetting resin are mixed together, the molding member 370 is formed using the mixture so that the phosphor can be dispersed in the molding member 370.

The LED package according to this embodiment may further comprise a reflective portion. FIGS. 9 and 10 show LED packages with such a reflective portion.

Referring to FIG. 9, the light emitting device 350 is mounted within a reflective portion 340. The reflective portion 340 may be formed by mechanically processing the substrate (310 in FIG. 8) to form a predetermined groove. An inner wall of the groove is formed to have a certain slope. As a result, light emitted from the light emitting device 350 and then incident on the reflective portion 340 is reflected from the reflective portion 340 to the outside so that luminance of the light can be improved. It is preferred that a bottom surface of the groove is in the form of a plane to mount the light emitting device 350 thereon.

Referring to FIG. 10, a reflective portion 360 is formed on a flat substrate 310 to surround a light emitting device 350. The reflective portion 360 has a certain slope to reflect light, which is incident from the light emitting device 350, to the outside. The reflective portion 360 may be formed by molding a thermoplastic or thermosetting resin. Meanwhile, a molding member 370 encapsulates the light emitting device 350 by filling the inside of the reflective portion 360.

Further, the reflective portion 360 and the substrate 310 may be formed integrally with each other. At this time, lead electrodes 320 and 325 are formed using a lead frame, and the reflective portion 360 and the substrate 310 are formed by insert-molding the lead frame.

Figure 11:
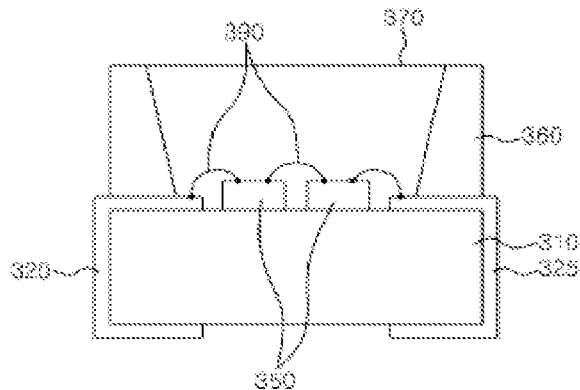
FIG. 11 is a sectional view illustrating an LED package on which a plurality of light emitting devices with an array of light emitting cells coupled in series are mounted.

The LED packages according to embodiments of the present invention may comprise one or more light emitting devices 350 as described above. FIG. 11 is a sectional view illustrating an LED package having a plurality of light emitting devices 350.

Referring to FIG. 11, the LED package according to this embodiment comprises a substrate 310, lead electrodes 320 and 325 formed on the substrate 310, and a plurality of light emitting devices 350 mounted on the substrate 310. To enhance luminance of light, a reflective portion 360 is formed to surround the light emitting devices 350, and a molding member 370 encapsulating the light emitting devices 350 is formed over the light emitting devices 350. Further, the lead electrodes 320 and 325 are formed on the substrate 350 and connected to the plurality of light emitting devices 350 through bonding wires 390. Accordingly, the plurality of light emitting devices 350 can be connected to an external power source through the lead electrodes 320 and 325 and the bonding wires 390.

As described with reference to FIG. 8, each of the light emitting devices 350 comprises an array of light emitting cells coupled in series.

According to this embodiment, the plurality of light emitting devices 350 are variously mounted in series, parallel or series-parallel on the substrate 310 to obtain desired luminous power, and high luminous power can be obtained by mounting the plurality of light emitting devices 350.

Figure 12:
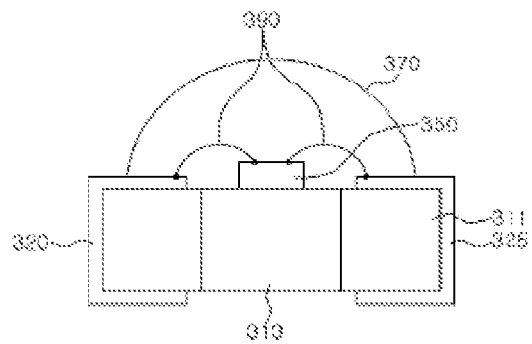
FIGS. 12 and 13 are sectional views illustrating LED packages each of which employs a heat sink, according to some embodiments of the present invention.
Figure 13:
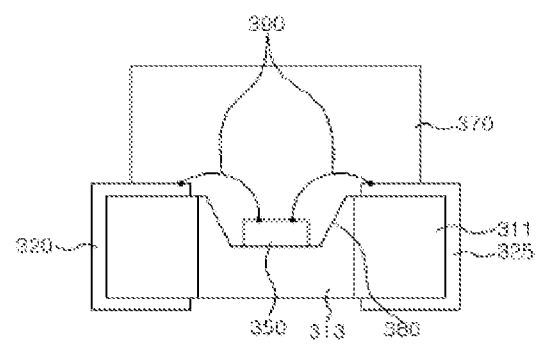

FIGS. 12 and 13 are sectional views illustrating LED packages each of which employs a heat sink according to some embodiments of the present invention.

Referring to FIG. 12, the LED package according to this embodiment comprises a substrate or housing 311, which is formed with lead electrodes 320 and 325 at both sides thereof and also has a through-hole, a heat sink 313 mounted inside the through-hole of the housing 311, a light emitting device 350 mounted on the heat sink 313, and a molding member 370 encapsulating the light emitting device 350.

The heat sink 313 mounted inside the through-hole of the housing 311 is made of a material with superior thermal conductivity and dissipates heat generated from the light emitting device 350 to the outside. As shown in FIG. 13, the heat sink 313 may have a recessed region of an inverted frusto-conial shape in a predetermined region of the center thereof. The recessed region constitutes a reflective portion 380, and the light emitting device 350 is mounted on a bottom surface of the recessed region. To enhance luminance and light-focusing performance, the recessed region of the inverted frusto-conial shape is formed to have a certain slope.

As described with reference to FIG. 8, the light emitting device 350 comprises an array of light emitting cells coupled in series. The light emitting device 350 is connected to the lead electrodes 320 and 325 through bonding wires 390. Further, in these embodiments, a plurality of light emitting devices 350 may be mounted on the heat sink 313.

As described with reference to FIG. 8, the molding member 370 encapsulating the light emitting device 350 may be formed in various shapes. Further, a phosphor (not shown) is formed over the light emitting device 350 to emit light of a target color.

Figure 14:
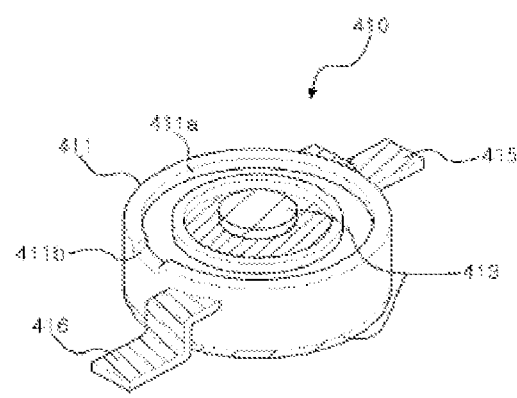
FIGS. 14 to 18 are views illustrating LED packages each of which employs a heat sink, according to other embodiments of the present invention.
Figure 15:
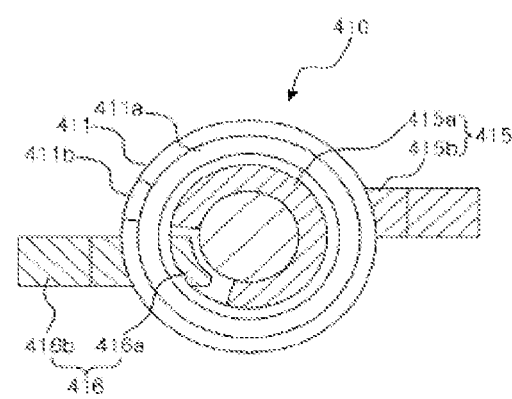
Figure 16:
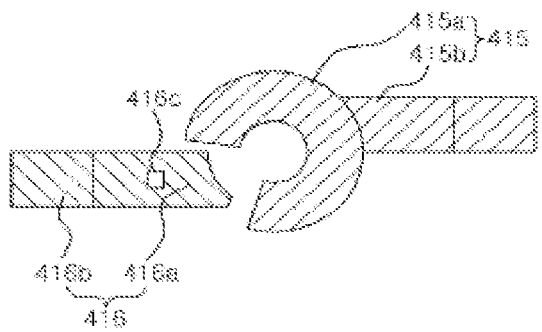
Figure 17:
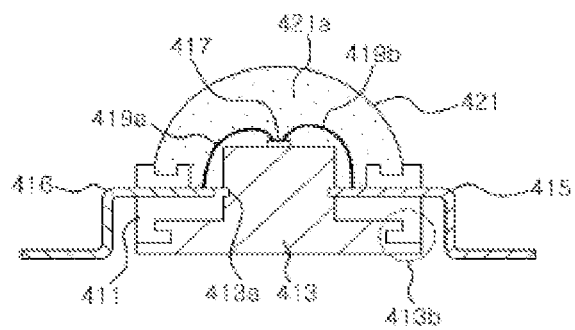

FIGS. 14 to 17 are views illustrating LED packages each of which employs a heat sink according to other embodiments of the present invention. FIGS. 14 and 15 are perspective and plan views illustrating an LED package 410 according to an embodiment of the present invention, respectively, and FIG. 16 is a plan view illustrating lead frames 415 and 416 used in the LED package 410. Meanwhile, FIG. 17 is a sectional view illustrating the LED package.

Referring to FIGS. 14 to 17, the LED package 410 comprises a pair of lead frames 415 and 416, a heat sink 413 and a package body 411 supporting the lead frames and the heat sink.

As shown in FIG. 17, the heat sink 413 may have a base and a protrusion protruding upwardly from a central portion of the base. Although the base and the protrusion can have cylindrical shapes as shown in the figure, they are not limited thereto but may have various forms such as a polygonal post and combinations thereof. Meanwhile, an external appearance of the package body 411 may be modified depending on the shape of the base of the heat sink 413. For example, in a case where the base is in the form of a cylinder, the external appearance of the package body 411 may be a cylinder as shown in the figure. Alternatively, in a case where the base is in the form of a rectangular post, the external appearance of the package body 411 may be a rectangular post.

The heat sink 413 has a lead frame-receiving groove 413a for receiving the lead frame 415 at a side surface of the protrusion. Although the receiving groove 413a can be formed at a portion of the side surface of the protrusion, it may be preferably formed as a continuous groove along the side surface of the protrusion. Accordingly, it is easy to combine the lead frame 415 into the continuous receiving groove 413a regardless of rotation of the heat sink 413.

Meanwhile, the heat sink 413 may have a latching groove at a side surface 413b of the base. The latching groove may be formed at a portion of the side surface 413b of the base, or it may be continuous along the surface thereof. Since heat dissipation is promoted as a bottom surface of the heat sink 413 becomes broader, a lower end portion of the side surface of the base may be exposed to the outside as shown in FIGS. 14 and 17. However, the latching groove and a portion of the side surface of the base above the latching groove are covered with the package body 411. Thus, the latching groove receives a portion of the package body 411, so that the heat sink 413 can be prevented from being separated from the package body 411.

The heat sink 413 is made of a conductive material, particularly, a metal such as copper (Cu) or aluminum (Al), or an alloy thereof. Further, the heat sink 413 may be formed using a molding or pressing technique.

The pair of lead frames 415 and 416 are located around the heat sink 413 while being spaced apart from each other. The lead frames 415 and 416 have inner lead frames 415a and 416a, and outer lead terminals 415b and 416b, respectively. The inner lead frames 415a and 416a are located inside the package body 411, and the outer lead frames 415b and 416b extend from the inner lead frames and protrude toward the outside of the package body 411. At this time, the outer lead frames 415b and 416b may be bent for surface mounting.

Meanwhile, the inner lead frame 415a is combined into the receiving groove 413a of the heat sink 413 and then electrically connected directly to the heat sink. As shown in FIG. 16, the inner lead frame 415a may take the shape of a ring of which a portion is removed to be received in the receiving groove 413a of the heat sink 413. As the portion removed from the ring-shaped inner lead frame becomes smaller, a contact surface between the heat sink 413 and the inner lead frame 415a more increases to reinforce electrical connection. At this time, the inner lead frame 415a may take various shapes such as a circular ring or a polygonal ring depending on the shape of the protrusion of the heat sink 413.

On the other hand, the inner lead frame 416a is located while being spaced apart from the heat sink 413. The inner lead frame 416a is located at the removed portion of the inner lead frame 415a so that it can be located close to the heat sink 413. The lead frame 416 may have a fastening groove 416c, and the fastening groove 416c receives a portion of the package body 411 so that the lead frame 416 can be prevented from being separated from the package body 411. The lead frame 415 may also have a fastening groove.

The package body 411 supports the heat sink 413 and the lead frames 415 and 416. The package body 411 may be formed using an insert-molding technique. That is, the package body 411 may be formed by combining the lead frame 415 into the receiving groove of the heat sink 413, positioning the lead frame 416 at a corresponding position, and insert-molding a thermoplastic or thermosetting resin. Using the insert-molding technique, the package body 411 of such a complicated structure can be easily formed. At this time, the protrusion of the heat sink 413 may protrude upwardly beyond the top of the package body 411.

Meanwhile, the package body 411 has an opening for exposing portions of the respective inner lead frames 415*a* and 416*a*, and a portion of the protrusion of the heat sink 413. Thus, a groove is formed between the protrusion of the heat sink 413 and the package body 411. As shown in FIGS. 14 and 15, although the groove may be a continuous groove along the periphery of the protrusion, it is not limited thereto but may be intermittent.

Further, the package body 411 may further comprise an encapsulant receiving groove 411*a* located along the outer periphery thereof. The encapsulant receiving groove 411*a* receives a molding member or encapsulant 421 so that the encapsulant 421 is prevented from being separated from the package body 411. In addition thereto, a marker 411*b* for indicating the positions of the lead frames 415 and 416 may be formed at the package body as shown in FIGS. 14 and 15. The marker 411*b* indicates the position of the lead frame 415 directly connected to the heat sink 413 and the position of the lead frame 416 spaced apart from the heat sink.

Since the package body 411 is formed using the insert-molding technique, it fills the latching groove formed at the side surface 413*b* of the base of the heat sink 413, thereby supporting the heat sink. In addition thereto, the lead frame 415 is received in the receiving groove 413*a* of the heat sink, and the lead frame is also supported by the package body. Further, the package body fills the remainder of the receiving groove 413*a* except the portion thereof contacted with the lead frame. Thus, according to the embodiments of the present invention, the heat sink is prevented from being separated from the package body.

Referring again to FIG. 17, a light emitting device 417 is mounted on the heat sink 413. The light emitting device 417 comprises an array of light emitting cells coupled in series through bonding wires 80 as described with reference to FIGS. 1 and 2, or comprises a submount 2000 with electrode patterns 250 and an array of light emitting cells coupled in series through the electrode patterns 250 of the submount 2000. The light emitting device 417 may comprise at least one array of light emitting cells, and may comprise at least two arrays of light emitting cells connected in reverse parallel and/or an additional rectification bridge unit for a predetermined rectification operation.

The light emitting device 417 is electrically connected to the lead frames 415 and 416 through bonding wires 419*a* and 419*b*. For example, in a case where the light emitting device 417 is an LED chip described with reference to FIG. 1 or 2, the bonding wires 419*a* and 419*b* connect the bonding pads (90 and 95 of FIG. 1 or 2) formed at both ends of the array of light emitting cells coupled in series to the lead frames 415 and 416.

Further, in a case where the light emitting device 417 comprises the submount 2000 and the light emitting cells 100 bonded on the submount as described with reference to FIGS. 3 to 5, the bonding wires 419*a* and 419*b* connect the bonding pads 240 and 250 formed on the submount to the lead frames 415 and 416. If the LED chip 1000 is bonded to the submount 2000 as shown in FIG. 3 or 5, the submount 2000 is interposed between the LED chip 1000 and the heat sink 413.

The bonding wire 419*b* may be connected directly to the lead frame 415 or the heat sink 413.

Meanwhile, the encapsulant 421 covers the top of the LED chip 417. The encapsulant 421 may be an epoxy or silicone resin. Further, the encapsulant may contain a phosphor 421*a* for converting the wavelength of light emitted from the LED chip 417. For example, in a case where the LED chip 417 emits blue light, the encapsulant 421 may contain the phosphor 421*a* for converting the blue light into yellow light, or green and red light. As a result, white light is emitted from the LED package to the outside.

The encapsulant 421 fills the opening of the package body 411 and the encapsulant receiving groove 411*a*. Therefore, the bonding force of the encapsulant 421 with the package body 411 increases so that the encapsulant is prevented from being separated from the LED package. Meanwhile, the encapsulant 421 may be a lens and take the shape of a convex lens such that light emitted from the LED chip 417 emerges in a predetermined range of directional angles as shown in FIG. 17. Otherwise, the encapsulant may have various shapes depending on the object of use thereof.

Figure 18:
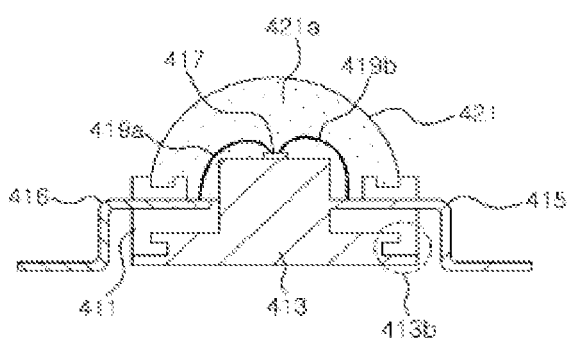

FIG. 18 is a sectional view illustrating an LED package employing a heat sink according to a further embodiment of the present invention.

Referring to FIG. 18, the LED package according to this embodiment comprises a pair of lead frames 415 and 416, a heat sink 413 and a package body 411. Further, as described with reference to FIG. 17, a light emitting device 417 is mounted on the heat sink 413, bonding wires 419*a* and 419*b* connect the light emitting device 417 to the lead frames 415 and 416, and an encapsulant 421 covers the top of the LED chip 417. A phosphor 421*a* may be contained within the encapsulant 421. Features thereof different from the LED package of FIG. 17 will be described below.

In the LED package according to this embodiment, the heat sink 413 and the lead frame 415 are formed integrally with each other. That is, the lead frame 415 is made of the same material as the heat sink 413, and formed together with the heat sink 413. Since the heat sink 413 and the lead frame 415 are formed integrally with each other, the receiving groove (413*a* of FIG. 17) for the lead frame can be eliminated.

According to this embodiment, since the heat sink 413 and the lead frame 415 are formed integrally with each other, the heat sink 413 can be more prevented from being separated from the package body 411.

Figure 19:
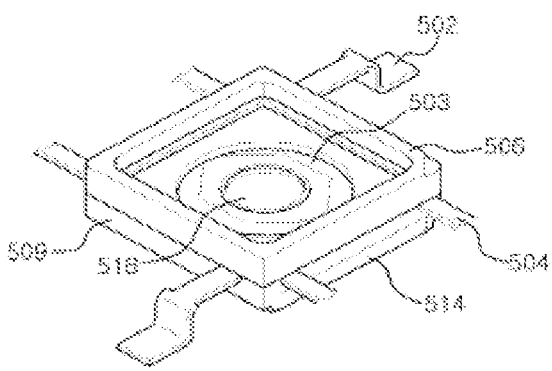
Figure 22:
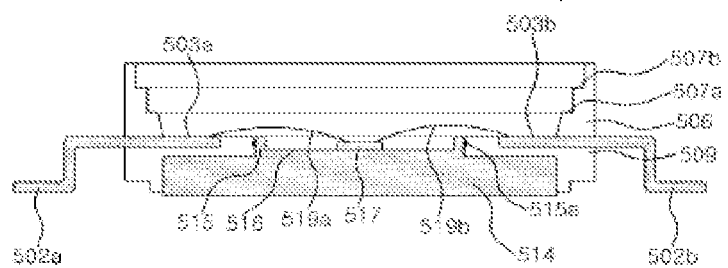
Figure 23:
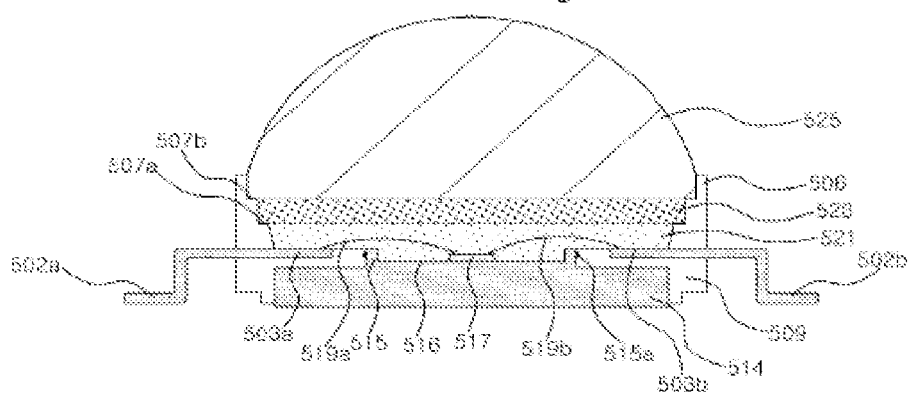

FIGS. 19 to 23 are views illustrating LED packages each of which employs a heat sink according to further embodiments of the present invention. Here, FIGS. 19 and 20 are upper and lower perspective views illustrating an LED package according to an embodiment of the present invention, and FIG. 21 is an exploded perspective view illustrating the LED package. Meanwhile, FIG. 22 is a sectional view showing that an LED chip is mounted on the LED package of FIGS. 19 and 20 and connected thereto through bonding wires, and FIG. 23 is a sectional view showing that a molding member is formed on an LED package of FIG. 22 and a lens is mounted thereon.

Referring to FIGS. 19 to 21, the LED package of the present invention comprises a package body including a first package body 506 and a second package body 509. Although the first package body and the second package body may be separately fabricated, they may be formed integrally with each other using an insert-molding technique. If they are formed integrally with each other, they are not separated into the first package body 506 and the second package body 509. For the sake of convenience of description, however, they are shown in a separated state.

The first package body 506 has an opening 508 and is formed at an upper face thereof with a groove that is recessed to receive an encapsulant or a molding member and surrounded by an inner surface thereof. Although the opening 508 has the same area as the recessed portion, it may have an area smaller than that of the recessed portion as shown in the figure. A stepped portion 507 may be formed in the inner wall of the first package body to receive the molding member that will be described later. The second package body 509 has a through-hole 511 exposed through the opening of the first package body 506. Further, inner frame-receiving grooves 510 are formed in an upper face of the second package body 509, and a heat sink-seating groove 512 is formed in a lower face thereof. The inner frame-receiving grooves 510 are located around the through-hole 511 while being spaced apart therefrom.

A pair of lead frames 501 are located between the first package body 506 and the second package body 507 while being spaced apart from each other. The lead frames 501 have a pair of inner frames 503 exposed through the opening of the first package body 506, and outer frames 503 extending from the inner frames and protruding to the outside of the package body. The inner frames 503 are arranged to form a symmetric structure so that a hollow portion 505 can be defined at a central position therebetween. The inner frames 503 are seated inside the inner frame-receiving grooves 510 such that the through-hole 511 is located inside the hollow portion 505.

Meanwhile, each of the inner frames 503 may have supports 504 extending therefrom. The supports 504 function to support the lead frames 501 when a lead panel (not shown) having a plurality of lead frames 501 connected thereto is used for mass-production of LED packages. Further, as shown in FIGS. 19 and 20, the outer frames 502 may be bent such that the LED package can be mounted on the surface of a printed circuit board or the like.

Meanwhile, the lead frames 501 can form a symmetric structure as shown in the figure but is not limited thereto. Moreover, although the hollow portion 505 surrounded by the inner frames may have a hexagonal shape, it is not limited thereto but may have various shapes such as a circle, a rectangle and the like.

The heat sink 513 is combined with the second package body 509 on the lower face of the second package body 509. The heat sink 513 has a base 514 seated in the heat sink-seating groove 512 of the second package body, and a protrusion 515 to be combined with the second package body while protruding at a central portion of the base and to be inserted into the through-hole 511 of the second package body. A latching step may be formed on a side surface of the protrusion 515. An upper surface 516 of the protrusion 515 may be recessed and exposed through the opening 508 of the first package body 506.

Meanwhile, the first and second package bodies 506 and 509 can be made of materials such as thermal conductive plastics or high thermal conductive ceramics. The thermal conductive plastics include acrylonitrile butadiene styrene (ABS), liquid crystalline polymer (LCP), polyamide (PA), polyphenylene sulfide (PPS), thermoplastic elastomer (TPE) and the like. The high thermal conductive ceramics include alumina (Al$_2$O$_3$), silicon carbide (SiC), aluminum nitride (AlN) and the like. Among the ceramics, aluminum nitride (AlN) has properties equivalent to those of alumina and is superior to alumina in view of thermal conductivity. Thus, aluminum nitride has been widely used in practice.

If the first and second package bodies 506 and 509 are made of thermal conductive plastics, they may be formed using an insert-molding technique after the lead frames 501 are located therebetween.

On the other hand, if the first and second package bodies 506 and 509 are made of the high thermal conductive ceramics, the first package body 506 and the second package body 509 may be separately formed and then fixedly attached thereto using an adhesive with strong adhesive force or the like.

Referring to FIG. 22, in the LED package according to the present invention, two stepped portions 507 are formed in the inner wall of the first package body 506, so that they can serve as fixing steps for use in molding the molding member or in mounting a lens, which will be described later.

Meanwhile, a latching step 515a of the heat sink 513 is formed at an side surface of the protrusion 515 so that it can be fixedly inserted into a groove formed in a wall defining the through-hole 515 of the second package body 509. Further, the latching step 515a may be formed at an upper portion of the protrusion 515 to be coupled to the upper face of the second package body 509. Accordingly, the heat sink 513 can be prevented from being separated from the package body. The latching step may be formed on a side surface of the base.

The heat sink 513 is made of a thermally conductive material, particularly, a metal such as copper (Cu) or aluminum (Al), or an alloy thereof. Further, the heat sink 513 may be formed using a molding or pressing technique.

The light emitting device 517 is mounted on the upper surface 516 of the heat sink 513. Since the light emitting device 517 is the same as the light emitting device 417 described with reference to FIG. 17, a description thereof will be omitted.

Referring to FIG. 23, molding members 521 and 523 encapsulate the top of the light emitting device 517 and are molded inside the groove of the first package body 506. The molding member can comprise the first molding member 521 and the second molding member 523. Each of the first and second molding members may be made of an epoxy or silicone resin, and they may be made of the same material or different materials. It is preferred that the second molding member 523 have a value of hardness larger than that of the first molding member 521. The first and second molding members can fill the groove of the first package body 506 to form an interface in the vicinity of the stepped portions 507a.

Meanwhile, a phosphor may be contained in the first molding member 521 and/or the second molding member 523. Further, a diffuser for diffusing light may be contained in the first molding member 521 and/or the second molding member 523. The phosphor is applied on the light emitting device 517 so that it may be disposed between the first molding member 521 and the light emitting device 517, or on the first molding member 521 or the second molding member 523.

Further, a lens 525 may be disposed on the top of the molding member. The lens 525 is fixed to an upper one of the stepped portions 507b. The lens 525 take the shape of a convex lens such that light emitted from the LED chip 517 emerges in a predetermined range of directional angles as shown in the figure. Otherwise, the lens may have various shapes depending on the object of use thereof.

Figure 24:
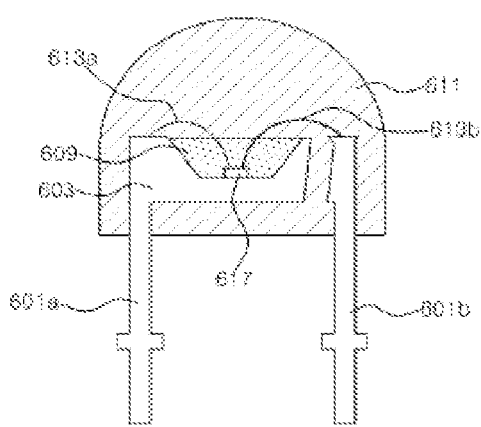
FIG. 24 is a sectional view illustrating an LED lamp having light emitting cells coupled in series according to an embodiment of the present invention.

FIG. 24 is a sectional view illustrating an LED lamp having light emitting cells coupled in series according to an embodiment of the present invention.

Referring to FIG. 24, the LED lamp comprises a top portion 603, and a first lead with a pin-type leg 601a extending from the top portion 603. A second lead with a pin-type leg 601b is arranged to correspond to the first lead while being spaced apart from the first lead.

The light emitting device 617 is mounted on the top portion 603 of the first lead. The top portion 603 of the first lead may have a recessed cavity, and the light emitting device 617 is mounted inside the cavity. A sidewall of the cavity may form an inclined reflective surface such that light emitted from the light emitting device 617 can be reflected in a predetermined direction. The light emitting device 617 is electrically connected to the first and second leads through bonding wires 613a and 613b.

Since the light emitting device 617 is the same as the light emitting device 417 described with reference to FIG. 17, a description thereof will be omitted.

Meanwhile, a molding member 611 encapsulates the top portion 603 of the first lead, the light emitting device 617, and a portion of the second lead. The molding member 611 is generally formed of a transparent resin. The molding member 611 may protect the light emitting device 617 and simultaneously have a lens function of refracting light, which has been emitted from the LED chip 617, in a range of predetermined directional angles.

In addition thereto, an encapsulant 609 is formed inside the cavity to cover the top of the light emitting device 617. The encapsulant 609 may be made of an epoxy or silicone resin.

Meanwhile, the encapsulant 609 may contain a phosphor. The phosphor converts the wavelength of light emitted from the light emitting device 617 so that light with a desired wavelength can be emitted. The phosphor may be formed by being applied on the light emitting device 617.

The pin-type legs 601a and 601b are inserted through and mounted on a printed circuit board (PCB) (not shown), and a current is applied to the LED lamp through the PCB so that the light emitting device 617 can emit light. Meanwhile, the pin-type legs 601a and 601b may be directly connected to a socket of a household AC power source. Thus, the LED lamp can be used for general illumination at home.

Next, high flux LED lamps, which are a kind of LED lamp, according to other embodiments of the present invention will be described with reference to FIGS. 25 to 32.

Figure 25:
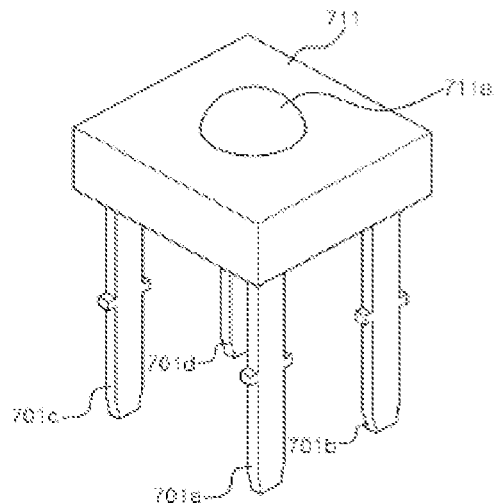
FIGS. 25 to 32 are views illustrating high flux LED lamps according to other embodiments of the present invention.
Figure 26:
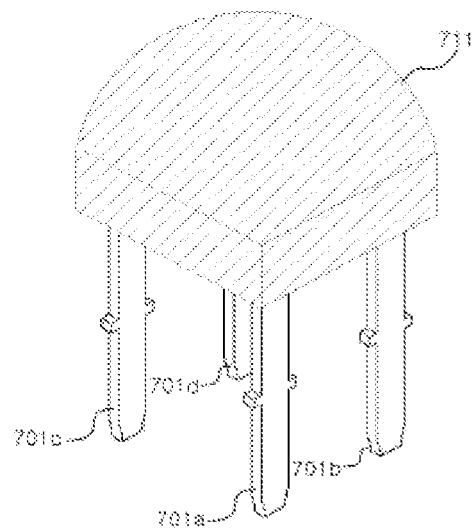
Figure 27:
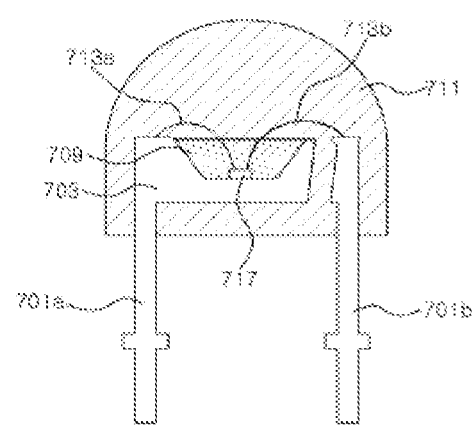

FIGS. 25 and 26 are perspective views illustrating high flux LED lamps according to other embodiments of the present invention, and FIG. 27 is a sectional view of FIG. 26.

Referring to FIGS. 25 to 27, the high flux light emitting diode (LED) lamp has a first lead and a second lead. The first lead has a top portion 703. Two pin-type legs 701a and 701c extend from the top portion 703 and are exposed to the outside. The second lead has two pin-type legs 701b and 701d corresponding to the first lead, and the two pin-type legs 701b and 701d are connected to each other at upper portions thereof. The first and second leads may be made of a metal such as copper or iron, or an alloy thereof, and they may be formed using a molding technique.

The top portion 703 of the first lead has an upper surface oil which a light emitting device 717 is to be mounted, and a lower surface. The upper surface of the top portion 703 may be a flat surface. Further, as shown in FIG. 27, a cavity may be formed in the upper surface of the top portion 703, and the light emitting device 717 is mounted inside the cavity. A sidewall of the cavity may form an inclined reflective surface such that light emitted from the LED can be reflected in a predetermined direction.

Since the light emitting device 717 is the same as the light emitting device 417 described with reference to FIG. 17, a description thereof will be omitted. The light emitting device 717 is electrically connected to the first and second leads through bonding wires 713a and 713b.

Meanwhile, molding member 711 encapsulates the top portion 703 of the first lead, the light emitting device 717 and a portion of the second lead. Although the molding member 711 may be formed of a transparent resin such as an epoxy or silicone resin, it may be formed of a translucent resin depending on the object thereof. The molding member 711 may protect the light emitting device 717 and simultaneously have a lens function of refracting light, which has been emitted from the LED chip 717, in a predetermined range of directional angles. Thus, an external appearance of the molding member 711 may take various shapes depending on a desired directional angle. For example, an upper portion of the molding member 711 may be convex with a smaller curvature to obtain a narrow range of directional angles, whereas the upper portion of the molding member 711 may be substantially flat with a larger curvature to obtain a wide range of directional angles. Further, as shown in FIG. 25, the molding member 711 may be formed such that a lens 711a is defined in the vicinity of the upper portion of the light emitting device 717. Alternatively, as shown in FIG. 26, the molding member 711 may be formed such that the entire upper portion thereof takes the shape of a lens.

In addition thereto, an encapsulant 709 may be formed inside the cavity to cover the top of the light emitting device 717. The encapsulant 709 may be made of an epoxy or silicone resin. Meanwhile, the encapsulant 709 may contain a phosphor as described with reference to FIG. 24.

The pin-type legs 701a, 701b, 701c and 701d are inserted through and mounted on a printed circuit board (PCB) (not shown), and may be then fixed by means of soldering. A current is applied to the LED lamp through the PCB so that the light emitting device can emit light.

Figure 28:
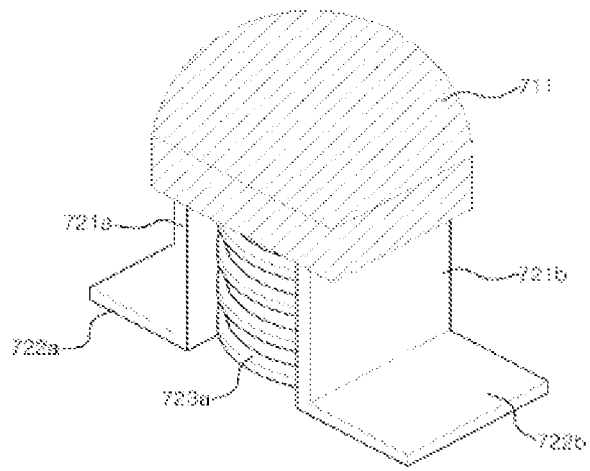
Figure 29:
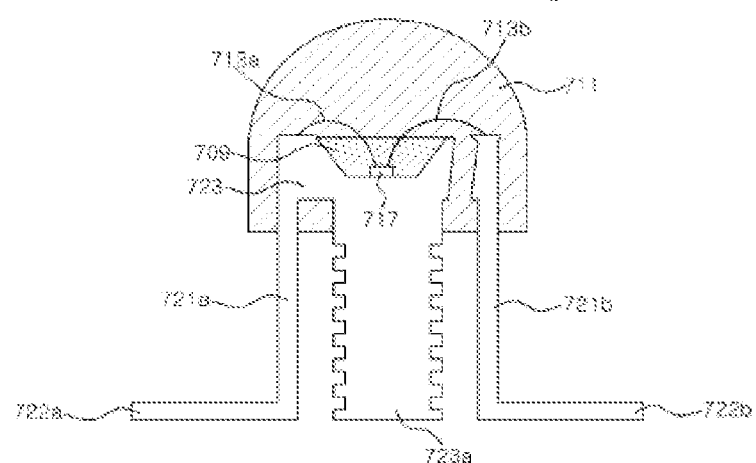
Figure 30:
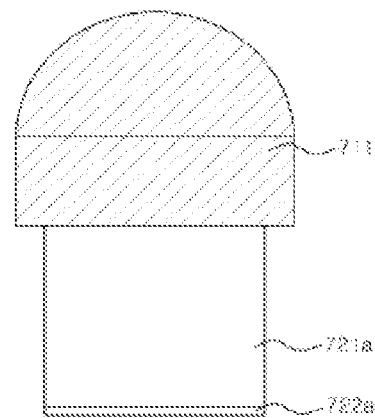

FIG. 28 is a perspective view illustrating a high flux LED lamp according to a further embodiment of the present invention, and FIGS. 29 and 30 are sectional and side views of FIG. 28, respectively.

Referring to FIGS. 28 to 30, the LED lamp comprises a top portion 723 and a first lead with a snap-type leg 721a extending from the top portion 723. The snap-type leg 721a has a wide side surface and a bent portion 722a that is bent substantially perpendicularly at a lower portion thereof. Further, a second lead with a snap-type leg 721b is arranged to correspond to the first lead while being spaced apart therefrom. The snap type leg 721b of the second lead also has a wide side surface and a bent portion 722b that is bent substantially perpendicularly at a lower portion thereof. It is preferred that the bent portions 722a and 722b extend in opposite directions. The first and second leads may be made of a metal such as copper or iron, or an alloy thereof, and they may be formed using a molding technique.

As described with reference to FIG. 27, the top portion 723 of the first lead has an upper surface on which a light emitting device 717 is to be mounted and a lower surface. The upper surface of the top portion 723 may be a flat surface. Alternatively, as shown in FIG. 29, a cavity may be formed in the upper surface of the top portion 723, and the light emitting device 717 is mounted inside the cavity. A sidewall of the cavity may form an inclined reflective surface such that light emitted from the LED can be reflected in a predetermined direction.

As described with reference to FIG. 27, the light emitting device 717 is electrically connected to the first and second leads through bonding wires 713a and 713b. Thus, after the bent portions 722a and 722b of the first and second leads are fixed to the PCB, a current is applied to the LED lamp through the PCB.

Meanwhile, as described above, the molding member 711 encapsulates the top portion 723 of the first lead, the light emitting device 717 and a portion of the second lead, and an encapsulant 709 can cover the light emitting device 717 inside the cavity. Further, the encapsulant 709 may contain a phosphor.

Meanwhile, a heat sink 723a may extend from the top portion 723 of the first lead in a direction parallel with the leg 721a of the first lead. The heat sink 723a protrudes at least outside the molding member 711. The heat sink 723a may extend to the lowermost portion of the leg 721a of the first lead. Accordingly, in a case where the LED lamp is mounted on the PCB, the heat sink 723a may also be attached to the PCB. The heat sink 723a may have grooves on the surface thereof. The grooves increase the surface area of the heat sink 723a. Such grooves may be formed to have various shapes and widths. The heat sink 723a may be formed integrally with the top portion 723 and leg 721a of the first lead.

According to the embodiments of the present invention, the LED chip 717 emits light by means of the current applied thereto and also generates heat at this time. The heat generated from the LED chip 717 is dissipated to the outside via the top portion 723 and leg 721a of the first lead, the second lead and the wires 713a and 713b. Since the legs 721a and 721b of the first and second leads are of a snap type, the surface area thereof is broader than those of the pin-type legs. Thus, the heat dissipation performance of the LED lamp is enhanced. In addition thereto, in a case where the heat sink 723a extends from the top portion 723 of the first lead, heat can be dissipated through the heat sink 723a, so that the heat dissipation performance of the LED lamp can be more enhanced. The heat sink 723a may extend from the top portion 703 of the high flux LED lamp with the pin-type legs 701a to 701d described with reference to FIGS. 25 to 27.

Figure 31:
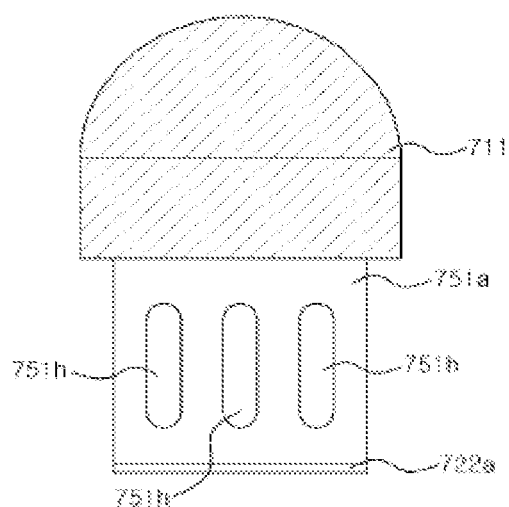
Figure 32:
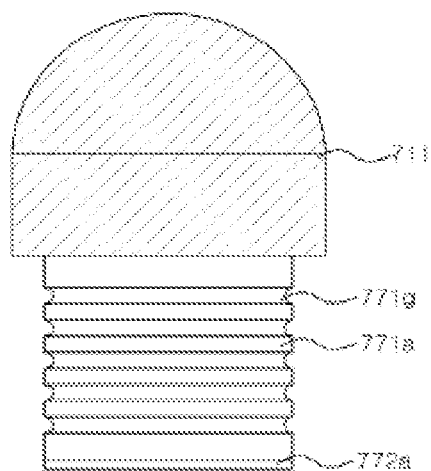

FIGS. 31 and 32 are side views illustrating high flux LED lamps in which heat dissipation performance is enhanced by modifying the snap-type legs 721a and 721b.

Referring to FIG. 31, although the LED lamp has the same components as the LED lamp described with reference to FIGS. 28 to 30, it has a snap-type leg 751a of a first lead and/or a snap-type leg (not shown) of a second lead, which are modified from the snap-type legs 721a and 721b of the first lead and/or the second lead. That is, the leg 751a of the first lead has at least one through-hole 751h through which air can pass. Further, the leg of the second lead may also have at least one through-hole through which air can pass. The through-holes 751h may be formed to take various shapes such as a rectangle, a circle, and an ellipse. Moreover, the through-holes 751h may be arranged in various patterns within the leg 751a of the first lead. That is, as shown in FIG. 31, the through-holes may be arranged in rows, in columns, or in a matrix. The through-holes 751h may also be arranged within the leg of the second lead.

According to this embodiment, since air can pass through the through-holes 751h, the legs of the leads can be cooled by means of convection. Thus, the heat dissipation performance of the LED lamp can be more enhanced.

Referring to FIG. 32, although the LED lamp according to this embodiment has the same components as the LED lamp described with reference to FIGS. 28 to 30, it has a snap-type leg 771a of a first lead and/or a snap-type leg (not shown) of a second lead, which are modified from the snap-type legs 721a and 721b of the first lead and/or the second lead. That is, the leg 771a of the first lead has grooves 771g. The grooves 771g may be formed on an outer surface and/or an inner surface of the leg 771a of the first lead. Further, the grooves 771g may be formed on the leg of the second lead. The grooves 771g may be formed to take various shapes such as a line and a spiral.

According to this embodiment, the surface area of the leg of the first lead and/or that of the second lead can be increased, thereby more enhancing heat dissipation performance through the leg of the first lead and/or the leg of the second lead.

What is claimed is:

1. A light emitting diode (LED) package, comprising:
 a package body comprising a substrate comprising a first side, a second side, and an opening, the first and second sides being opposite sides of the substrate;
 a metallic portion arranged in the opening, the metallic portion being exposed at the second side of the substrate;
 a first lead electrode and a second lead electrode spaced apart from each other and the metallic portion; and
 a light emitting device arranged on the metallic portion and electrically connected to the first lead electrode and the second lead electrode,
 wherein the entire first side of the substrate is substantially flat,
 wherein the light emitting device is arranged on a first side of the metallic portion, and the first lead electrode and the second lead electrode are arranged on the second side of the substrate,
 wherein the first side of the metallic portion is at an opposite side of the second side of the substrate,
 wherein the LED package is configured to be driven by an alternating current (AC) and by a voltage higher than that for driving one light emitting diode,
 wherein a second side of the metallic portion is substantially flush with the second side of the substrate, the second side of the metallic portion being an opposite side than the first side of the metallic potion,
 wherein inside surfaces of each of the first lead electrode and the second lead electrode only directly contact the substrate,
 wherein at least a portion of the first side of the metallic portion is substantially flush with the entire first side of the substrate,
 wherein the metallic portion consists of a homogenous metallic material structure, and
 wherein the substrate is an insulating substrate, and the metallic portion consisting of the homogenous metallic material structure directly contacts the insulating substrate in the opening.

2. The LED package of claim 1, wherein the first lead electrode and the second lead electrode extend from the second side of the substrate to the first side of the substrate, and the metallic portion is exposed at the first side of the substrate.

3. The LED package of claim 1, wherein the metallic portion comprises a recessed portion, and the light emitting device is arranged in the recessed portion.

4. The LED package of claim 1, further comprising:
 a molding member configured to convert a direction of light and/or a wavelength of light emitted from the light emitting device.

5. The LED package of claim 4, wherein the molding member comprises a phosphor.

6. The LED package of claim 1, wherein a side surface of the substrate contacting the metallic portion is parallel to side surfaces of each of the first lead electrode and the second lead electrode.

7. The LED package of claim 4, wherein the first lead electrode and the second lead electrode extend from the second side of the substrate to the first side of the substrate, and
 wherein a portion of each of the first lead electrode and the second lead electrode on the first side of the substrate is not covered by the molding portion.

8. A light emitting diode (LED) package, comprising:
 a substrate comprising a first side and a second side, the first and second sides being opposite sides of the substrate;

a metallic portion arranged in the substrate, the metallic portion being exposed at the second side of the substrate;

a first lead electrode and a second lead electrode spaced apart from each other and the metallic portion; and a light emitting device arranged on the metallic portion and electrically connected to the first lead electrode and the second lead electrode, wherein the entire first side of the substrate is substantially flat, wherein the light emitting device comprises a plurality of light emitting cells connected in series and is arranged on a first side of the metallic portion, and the first lead electrode and the second lead electrode are arranged on the second side of the substrate, wherein the first side of the metallic portion is at an opposite side of the second side of the substrate, wherein inside surfaces of each of the first lead electrode and the second lead electrode only directly contact the substrate, wherein a portion of the first side of the metallic portion is substantially flush with the entire first side of the substrate, wherein the metallic portion consists of a homogenous metallic material structure, and wherein the substrate is an insulating substrate, and the metallic portion consisting of the homogenous metallic material structure directly contacts the insulating substrate in the opening.

9. The LED package of claim 8, wherein a side surface of the substrate contacting the metallic portion is parallel to side surfaces of each of the first lead electrode and the second lead electrode.

10. The LED package of claim 8, wherein a second side of the metallic portion opposite to the first side of the metallic portion is substantially flush with the second side of the substrate.

11. The LED package of claim 8, further comprising:

a molding member configured to convert a direction of light and/or a wavelength of light emitted from the light emitting device.

12. The LED package of claim 11, wherein the first lead electrode and the second lead electrode extend from the second side of the substrate to the first side of the substrate, and wherein a portion of each of the first lead electrode and the second lead electrode on the first side of the substrate is not covered by the molding portion.

* * * * *